United States Patent
Anthony et al.

(10) Patent No.: US 6,404,674 B1
(45) Date of Patent: Jun. 11, 2002

(54) CLADDED READ-WRITE CONDUCTOR FOR A PINNED-ON-THE-FLY SOFT REFERENCE LAYER

(75) Inventors: Thomas C. Anthony; Manish Sharma, both of Sunnyvale, CA (US)

(73) Assignee: Hewlett Packard Company Intellectual Property Administrator, Fort Collins, CO (US)

( * ) Notice: Subject to any disclaimer, the term of this patent is extended or adjusted under 35 U.S.C. 154(b) by 0 days.

(21) Appl. No.: 09/825,461

(22) Filed: Apr. 2, 2001

(51) Int. Cl.[7] .............................................. G11C 11/15
(52) U.S. Cl. ....................................... 365/173; 365/171
(58) Field of Search ................................... 365/171, 173

(56) References Cited

U.S. PATENT DOCUMENTS

| | | | |
|---|---|---|---|
| 5,982,660 A | 11/1999 | Bhattacharyya et al. | 365/173 |
| 6,028,786 A | * 2/2000 | Nishimura | 365/171 |
| 6,072,717 A | 6/2000 | Burg et al. | 365/171 |
| 6,097,626 A | 8/2000 | Burg et al. | 365/171 |
| 6,111,784 A | * 8/2000 | Nishimura | 365/158 |
| 6,169,686 B1 | 1/2001 | Burg et al. | 365/171 |
| 6,172,901 B1 | 1/2001 | Anthony et al. | 365/173 |
| 6,196,930 B1 | 1/2001 | Anthony et al. | 257/295 |

OTHER PUBLICATIONS

Zhi G. Wang, Desmond J. Mapps, Lian N. He, Warwick W. Clegg, David T. Wilton, P. Robinson and Yoshihisa Nakamura—"Feasibility of Ultra–Dense Spin–Tunneling Random Access Memory"—Nov. 1997—4498–4511.

* cited by examiner

Primary Examiner—Richard Elms
Assistant Examiner—Van Thu Nguyen
(74) Attorney, Agent, or Firm—Trueman H. Denny, III

(57) ABSTRACT

A magnetic memory cell having read-write conductor that is wholly clad with a high magnetic permeability soft magnetic material for a pinned-on-the-fly soft ferromagnetic reference layer is disclosed. The magnetic memory cell includes a ferromagnetic data layer, an intermediate layer formed on the ferromagnetic data layer, and a soft ferromagnetic reference layer having a non-pinned orientation of magnetization formed on the intermediate layer. The soft ferromagnetic reference layer includes a read-write conductor and a ferromagnetic cladding that completely surrounds the read-write conductor to form a cladded read-write conductor. During a read operation, a read current flowing through the read-write conductor generates a read magnetic field that does not saturate the ferromagnetic cladding. During a write operation, a write current flowing through the read-write conductor generates a write magnetic field that saturates the ferromagnetic cladding and extends to the ferromagnetic data layer.

43 Claims, 9 Drawing Sheets

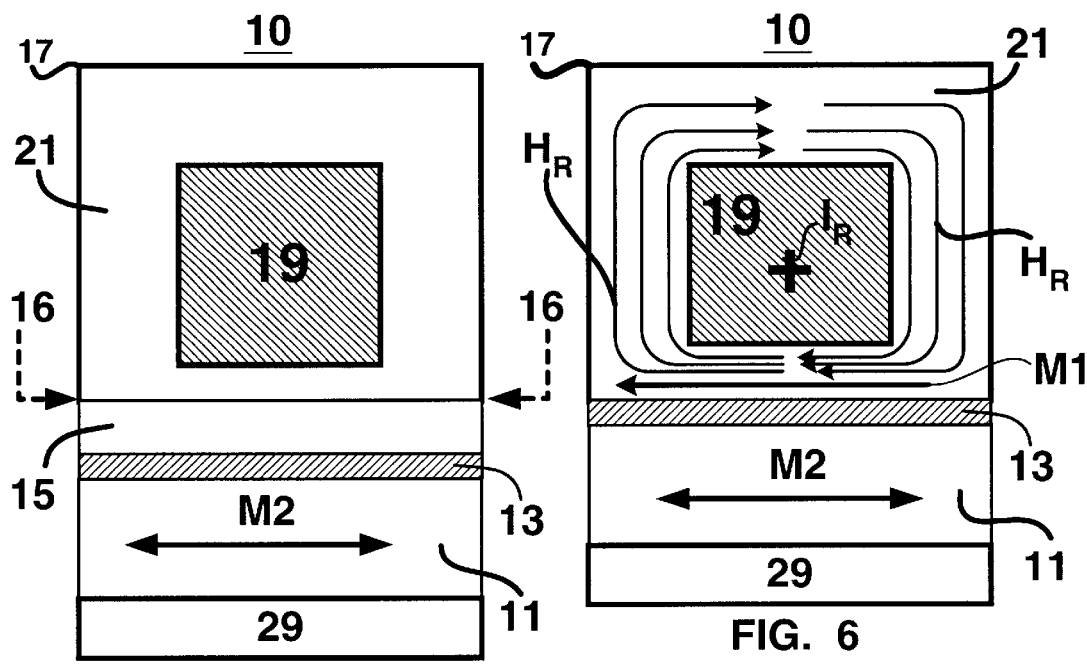
FIG. 5
FIG. 6
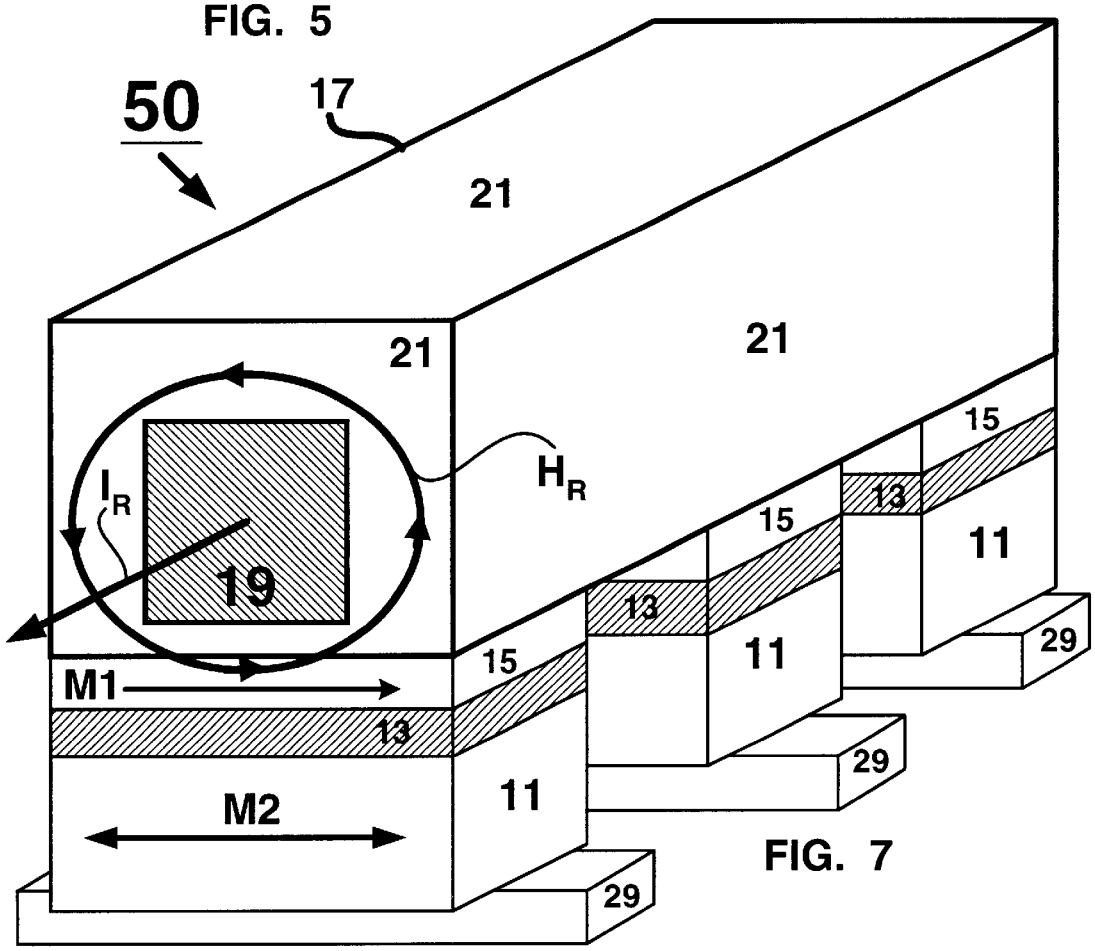
FIG. 7

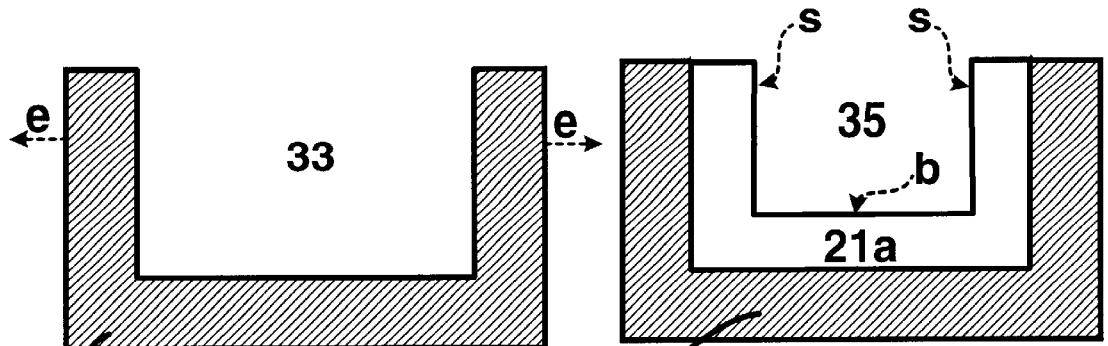
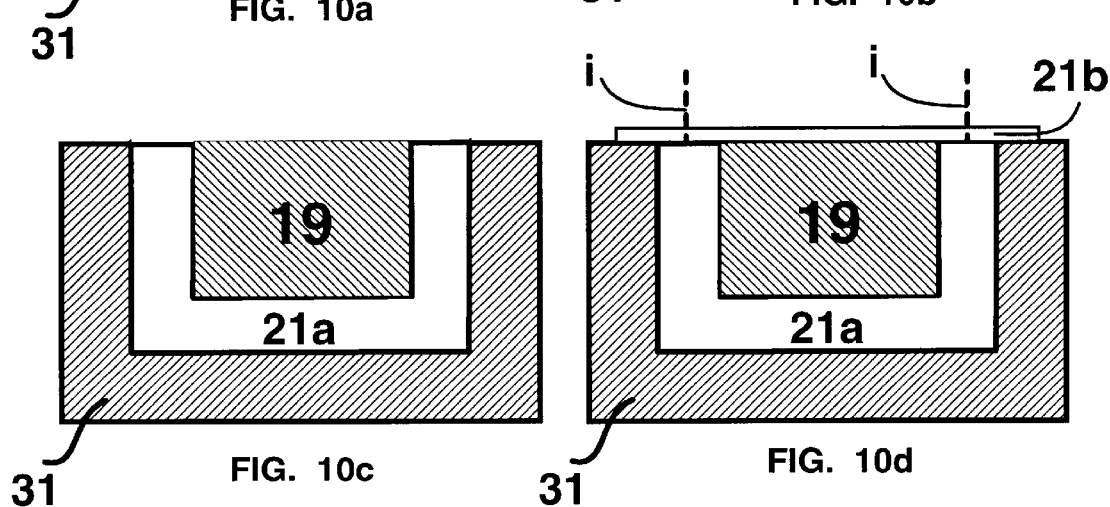
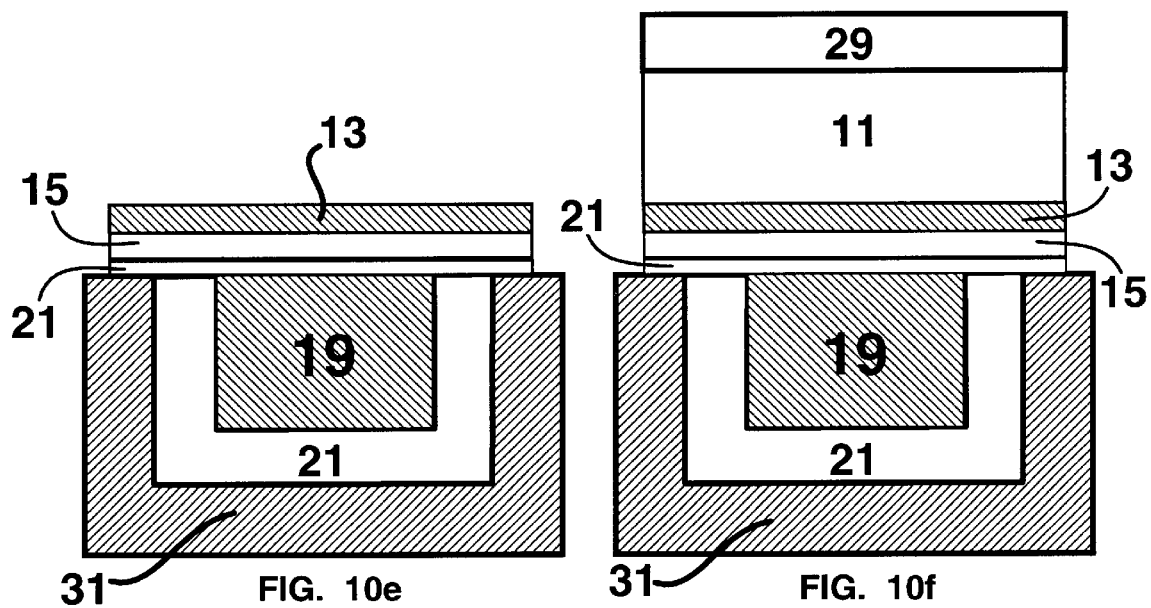

CLADDED READ-WRITE CONDUCTOR FOR A PINNED-ON-THE-FLY SOFT REFERENCE LAYER

FIELD OF THE INVENTION

The present invention relates generally to a magnetic memory cell with a soft ferromagnetic reference layer including a non-pinned orientation of magnetization and a wholly clad read-write conductor. More specifically, the present invention relates to a magnetic memory cell with a soft ferromagnetic reference layer having a non-pinned orientation of magnetization and including a read-write conductor that is completely surrounded by a ferromagnetic cladding so that a read magnetic field generated by a current flowing in the read-write conductor does not saturate and is substantially contained within the ferromagnetic cladding so that the orientation of magnetization is dynamically pinned-on-the fly during a read operation to the memory cell and a write magnetic field generated by a current flowing in the read-write conductor that saturates the ferromagnetic cladding and extends outward of the ferromagnetic cladding to interact with a data layer during a write operation to the memory cell.

BACKGROUND ART

A magnetic memory such as a magnetic random access memory (MRAM) is a non-volatile type of memory that is being considered as an alternative data storage device in applications where traditional data storage devices such as DRAM, SRAM, Flash, and hard disk drives have been used. An MRAM typically includes an array of magnetic memory cells. For instance, a prior magnetic memory cell can be a tunneling magnetoresistance memory cell (TMR), a giant magnetoresistance memory cell (GMR), or a colossal magnetoresistance memory cell (CMR) that includes a data layer (also called a storage layer or bit layer), a reference layer, and an intermediate layer between the data layer and the reference layer. The data layer, the reference layer, and the intermediate layer can be made from one or more layers of material. The data layer is usually a layer or a film of magnetic material that stores a bit of data as an orientation of magnetization that may be altered in response to the application of external magnetic fields. Accordingly, the orientation of magnetization of the data layer (i.e. its logic state) can be rotated (i.e. switched) from a first orientation of magnetization that can represent a logic "0", to a second orientation of magnetization that can represent a logic "1", or vice-versa. On the other hand, the reference layer is usually a layer of magnetic material in which an orientation of magnetization is "pinned" (i.e. fixed) in a predetermined direction. The predetermined direction is determined by microelectronic processing steps that are used to fabricate the magnetic memory cell.

Typically, the logic state (i.e. a "0" or a "1 ") of a magnetic memory cell depends on the relative orientations of magnetization in the data layer and the reference layer. For example, in a tunneling magnetoresistance memory cell (a tunnel junction memory cell), when an electrical potential bias is applied across the data layer and the reference layer, electrons migrate between the data layer and the reference layer through the intermediate layer (a thin dielectric layer usually called a tunnel barrier layer). The phenomenon that causes the migration of electrons through the barrier layer may be referred to as quantum mechanical tunneling or spin tunneling, The logic state can be determined by measuring the resistance of the memory cell. For example, the magnetic memory cell is in a state of low resistance if the overall orientation of magnetization in its data storage layer is parallel to the pinned orientation of magnetization of the reference layer. Conversely, the tunneling junction memory cell is in a state of high resistance if the overall orientation of magnetization in its data storage layer is anti-parallel to the pinned orientation of magnetization of the reference layer. As was mentioned above, the logic state of a bit stored in a magnetic memory cell is written by applying external magnetic fields that alter the overall orientation of magnetization of the data layer. Those external magnetic fields may be referred to as switching fields that switch the magnetic memory cell between its high and low resistance states.

FIG. 1 illustrates a prior tunnel junction memory cell 100 that includes a data layer 110, a reference layer 112, and an insulating barrier layer 114 that is positioned between the data layer 110 and the reference layer 112. Additionally, the memory cell 100 can include a first electrically conductive node 116 connected with the data layer 110 and a second electrically conductive node 118 connected with the reference layer 112. An externally supplied current can be passed through the first and second electrically conductive nodes (116, 118) to generate the aforementioned external magnetic fields. The first and second electrically conductive nodes (116, 118) can be the row and column conductors in a memory array that includes a plurality of the memory cells 100 as will be discussed in reference to FIGS. 4a and 4b below. The nodes can also be used to measure the resistance of the memory cell 100 so that its logic state can be determined. The reference layer 112 has an orientation of magnetization M1 that is pinned in a predetermined direction as illustrated by a left-pointing arrow. The data layer 110 has an alterable orientation of magnetization M2 as illustrated by the double arrow.

In FIG. 2a, the orientation of magnetization M2 of the data layer 110 is parallel (i.e. the arrows point in the same direction) to the orientation of magnetization M1 of the reference layer 112, resulting in the memory cell 100 being in a low resistance state. On the other hand, in FIG. 2b, the orientation of magnetization M2 of the data layer 110 is anti-parallel (i.e. the arrows point in opposite directions) to the orientation of magnetization M1 of the reference layer 112, resulting in the memory cell 100 being in a high resistance state.

Because the data layer 110 and the reference layer 112 are made from ferromagnetic materials that are positioned in close proximity to each other, the pinned orientation of magnetization M1 of the reference layer 112 generates a demagnetization field D that extends from an edge domain of the reference layer 112 to the data layer 110 as illustrated in FIG. 2c. FIG. 2d illustrates the effect of the demagnetization field D on the orientation of magnetization M2 of the data layer 110. Ideally, the orientation of magnetization of the data layer 110 would have an alignment that is either parallel or anti-parallel to the pinned orientation of magnetization M1. However, because of the demagnetization field D, there is a small angular displacement θ between an ideal orientation of magnetization M2' (shown as a dashed arrow) and an actual orientation of magnetization M2 (shown by a solid arrow). The angular displacement θ results in a reduction in a magnitude of change in magnetoresistance ΔR/R between the high and low states (i.e. parallel or anti-parallel). It is desirable to have the magnitude of change in magnetoresistance ΔR/R be as large as possible so that it is easier to detect the state of the bit in the data layer 110. Essentially, ΔR/R is like a signal-to-noise ratio S/N. During a read operation, a higher S/N results in a stronger signal that can be sensed to determine the state of the bit in the data layer 110. Therefore, one disadvantage of the prior tunnel junction memory cell 100 is the reduction in the magnitude of change in magnetoresistance ΔR/R (i.e. a lower S/N during a read operation) resulting from the angular displacement 8.

Another disadvantage of the prior tunnel junction memory cell 100 is that pinning the orientation of magnetization M1 of the reference layer 112 often requires more than one layer of material to effectuate the pinning. For instance, in FIG. 3a, a prior tunnel junction memory cell 200 includes the aforementioned data layer 210, first and second electrically conductive nodes (216, 218), and also includes a composite reference layer 212, 212a, and 212b that is a sandwich of different materials. The layer 212 is referred to as an antiferromagnet layer (a pinning layer) and the layer 212a is a pinned reference layer. The pinning layer 212 magnetize the orientation of magnetization M1 of the reference layer 212a in a desired direction. The layer 212b is a seed layer. Examples of materials used for the pinning layer 212, the reference layer 212a, and the seed layer 212b include: FeMn, IrMn, NiMn, or PtMn for the pinning layer 212; NiFe, NiFeCo, or CoFe for the reference layer 212a; and NiFe, or NiFeCo for the seed layer 212b.

Alternatively, a prior tunnel junction memory cell 300 having a pinning layer 312 of greater complexity than that shown in FIG. 3a is illustrated in FIG. 3b. The prior tunnel junction memory cell 300 includes the aforementioned data layer 310, first and second electrically conductive nodes (316, 318), and also includes a composite reference layer 312, 312a, 312b, and 312c, that is a complex sandwich of different materials. The pinning layer 312 sets the magnetization orientation of an artificial antiferromagnet 312c that has an even more complicated structure than the antiferromagnet layer 212 of FIG. 3a. The artificial antiferromagnet 312c can be a sandwich of materials such as: Co/Ru/Co; or CoFe/Ru/CoFe, for example. In FIG. 3b, layer 312a is the pinned reference layer, layer 312b is the seed layer, and layer 312 is the antiferromagnet layer (pinning layer).

Therefore, one disadvantage of the prior tunnel junction memory is that it requires more layers in its structure to form the reference layer. Because of the extra materials required to form those layers, extra microelectronic processing steps are required to fabricate the prior tunnel junction memory cells 200 and 300. Those extra steps can result in the possibility of defects being introduced into the tunnel junction memory that can cause the memory to be defective as manufactured or to later fail in a product that incorporates the memory. It is desirable to minimize the complexity and therefore the number of processing steps required to fabricate the memory in order to reduce defects and increase yield. Furthermore, the materials necessary to form the reference layer are themselves difficult materials to manufacture. For mass production of magnetic memories, it is desirable to use materials that are easy to make so that the manufacturing process is simplified and manufacturing costs are reduced.

An additional disadvantage of the prior tunnel junction memory is that the reference layer must be heated at an elevated temperature in an annealing step. Annealing takes time (an hour or more) and requires the magnetic memory to be subjected to temperatures ranging from 200 to 300 degrees centigrade under a constant magnetic field. Because setting the orientation of magnetization requires annealing in a magnetic field, there is a possibility that if the magnetic memory is later subjected to high temperatures, the pinning of the reference layer may become "unset" and lose its orientation of magnetization. To reset the orientation of magnetization, another annealing step would be required.

Another disadvantage of the prior tunnel junction memory cell 100 is illustrated in FIGS. 4a, 4b, and 4c. In FIG. 4a, a magnetic memory 150 includes a plurality of the memory cells 100 configured in a crosspoint array. The first electrically conductive node 116 is replicated to form row conductors (Row1 and Row2) that cross the memory cells 100 and the second electrically conductive node 118 is replicated to form column conductors (Col1, Col2, and Col3) that also cross the memory cells 100 (i.e. a memory cell 100 is located at the intersection of a row and column conductor). A memory cell 100a located at the intersection of Row2 and Col3 is selected for a read operation by connecting a voltage source V to Row2 with Row1 left floating. Col1 and Col2 are connected to GND and Col3 is connected to a sense amp S which is connected to a virtual ground. Consequently, a current path is formed and a current I flows into conductive node 116 of Row2. A portion of the current I flows to GND as indicated by currents $I_G$. However, another portion of the current I comprises a read current $I_R$ that is sensed by the sense amp S. The magnitude of $I_R$ is indicative of the orientation of magnetization of the bit of data stored in the memory cell 100a, but the magnitude of $I_R$ is not sufficient to rotate the orientation of magnetization of the data layer during the read operation.

In FIG. 4b, the selected memory cell 100a is shown in greater detail. The current $I_R$ generates a magnetic field $H_R$ in accordance with the right-hand rule. The disadvantage arises from the magnetic field $H_R$ extending radially outward from its respective conductors (i.e. fringe fields) and interacting with adjacent memory cells 100 in the array. Depending on the proximity of the memory cells 100 to each other and on the magnitude of the current $I_R$, those fringe fields can corrupt a data bit stored in the data layer 100 of neighboring memory cells 100 that have not been selected for a read operation.

Similarly, a memory cell 100b located at the intersection of Row1 and Col3 is selected for a write operation by passing a current Ix through Col3 and a current ly through Row1. The currents Ix and ly generate magnetic fields that cooperatively interact with the data layer to rotate the alterable orientation of magnetization thereby writing a new bit of data.

In FIG. 4c, the selected memory cell 100b is shown in greater detail. The current ly generates a magnetic field Hx in accordance with the right-hand rule. Similarly, the current Ix generates a magnetic field Hy in accordance with the right-hand rule. The disadvantage arises from those magnetic fields extending radially outward from their respective conductors (i.e. fringe fields) and interacting with adjacent memory cells 100 in the array during a write operation to the selected memory cell 100b. Depending on the proximity of the memory cells 100 to each other and on the magnitude of the currents Ix and Iy, those fringe fields can corrupt a data bit stored in the data layer 100 of neighboring memory cells 100 that have not been selected for a write operation. Because the magnitude of the currents Ix and Iy are greater for a write operation than for a read operation, the possibility for data corruption is even greater during a write operation where the resulting magnetic fields must extend to the data layer in order to rotate the orientation of magnetization.

Moreover, another disadvantage of the prior tunnel junction memory cell 100 is that the magnitude of the read current $I_R$, and the write currents Ix and Iy necessary to read and/or write data to a selected memory cell 100 can be quite large (the write currents are typically larger than the read current). Those currents can result in the generation of unwanted waste heat that can require thermal management systems such as cooling fans or the like to remove the waste heat. Thermal management systems can add to the cost, size, weight, and noise of an electronic system that incorporates the memory 150. For portable electronic systems that rely on a battery as a source for power or for electronic systems that are designed to be energy efficient, the aforementioned currents can increase power consumption thereby reducing battery life or can increase power drain thereby undermining energy efficiency.

Although the above disadvantages have focused on a tunnel junction memory cell (i.e. a TMR memory cell), those disadvantages also apply to other types of magnetic memory cells such as the aforementioned GMR and CMR memory cells. For instance, as is well understood in the art, for a GMR memory array (not shown) the crosspoint array is replaced with gate transistors (i.e. FET's) that electrically isolate the GMR memory cells. The FET's are electronically switched on or off to select a specific GMR cell for a read operation. A read current flowing through the selected memory cell can be sensed by a sense amp or the like. Therefore, there is a need for a magnetic memory cell having a reference layer that does not require a pinned orientation of magnetization in order to read a bit of data stored in the data layer. There is also a need to reduce the number of layers of material that are required to form the reference layer. Moreover, there exists a need for a magnetic memory cell in which fringe fields generated during a read or a write operation are substantially confined to the reference layer so that interference with nearby memory cells is substantially reduced. Additionally, there is a need for a magnetic memory cell in which the magnitude of a current necessary to effectuate a read or a write operation is reduced so that power consumption and power dissipation are reduced. Finally, there is a need for a magnetic memory cell in which angular displacement of the orientation of magnetization of the data layer is substantially reduced or eliminated so that there is a high magnitude of change in magnetoresistance during a read operation.

SUMMARY OF THE INVENTION

The present invention is an improvement in the design of magnetic memory cells such as tunneling magnetoresistance memory cells (TMR), giant magnetoresistance memory cells (GMR), and memories incorporating those types of magnetic memory cells. Moreover, the present invention includes improvements in the materials used for the reference layer of a magnetic memory cell and the structure used for the read-write conductor of a magnetic memory cell.

Broadly, the present invention is embodied in a magnetic memory cell including a ferromagnetic data layer for storing a bit of data as an alterable orientation of magnetization, a first conductor in electrical communication with the ferromagnetic data layer, an intermediate layer in contact with the ferromagnetic data layer, and a soft ferromagnetic reference layer in contact with the intermediate layer and including a read-write conductor and a ferromagnetic cladding that completely surrounds the read-write conductor to form a cladded read-write conductor. The ferromagnetic cladding includes a tailored thickness (i.e. it has a cross-sectional thickness that is thicker in some regions and thinner in other regions) including a thinner portion along a portion of the ferromagnetic cladding that is in contact with the intermediate layer and a thicker portion along portions of the ferromagnetic cladding that are not in contact with the intermediate layer The soft ferromagnetic reference layer has a non-pinned orientation of magnetization (i.e. the orientation of magnetization is not set in a predetermined direction).

During a read operation, an externally supplied current flows through the read-write conductor and the read-write conductor generates a read magnetic field in response to the current. The ferromagnetic cladding is not saturated by the read magnetic field and the read magnetic field is substantially contained within the ferromagnetic cladding (including the thinner portion). As a result of the read magnetic field, the orientation of magnetization of the soft ferromagnetic reference layer is pinned-on-the-fly to a desired direction. The bit of data stored in the ferromagnetic data layer is read by measuring a resistance between the soft ferromagnetic reference layer and the first conductor.

Conversely, during a write operation, a first write current is passed through the read-write conductor to generate a first write magnetic field that saturates the ferromagnetic cladding along the thinner portion and extends outward of the ferromagnetic cladding in a direction towards the ferromagnetic data layer, and a second write current is passed through the first conductor to generate a second write magnetic field that also extends to the ferromagnetic data layer. The first and second write magnetic fields cooperatively interact with the ferromagnetic data layer to rotate the alterable orientation of magnetization thereby writing a new bit of data to the ferromagnetic data layer. During the write operation, the first write magnetic field does not saturate the thicker portion of the ferromagnetic cladding.

An added benefit of the cladded read-write conductor of the present invention is that fringe fields are significantly reduced because the read magnetic field from the read-write conductor is contained substantially within the ferromagnetic cladding during a read operation and a thickness of the ferromagnetic cladding can be tailored such that during a write operation the first write magnetic field can be channeled in a direction that is substantially toward the ferromagnetic data layer so that fringe fields that could interact with neighboring memory cells are substantially reduced during the write operation.

During a read operation, the ferromagnetic cladding of the present invention provides a closed flux path (flux closure) for the read magnetic field. As a result, the demagnetization filed of prior magnetic memory cells is substantially reduced or eliminated so that angular displacement is minimized and there is a higher magnitude of change in magnetoresistance during a read operation.

The disadvantages of the prior pinned reference layer are solved by the soft ferromagnetic reference layer of the present invention because a read operation does not require that the orientation of magnetization of the soft ferromagnetic reference layer be pinned. Instead, to effectuate a read operation, the orientation of magnetization of the soft ferromagnetic reference layer of the present invention is dynamically pinned (i.e. it is pinned-on-the-fly) to a desired direction by passing a current of predetermined magnitude and direction through the read-write conductor. Consequently, the aforementioned additional layers of material, the complexity of those layers of material, and the microelectronics processing steps necessary to form those layers of material are reduced. The need to anneal the reference layer in a magnetic field is eliminated by the soft ferromagnetic reference layer of the present invention. Moreover, the possibility of having to "reset" the orientation of magnetization of the reference layer if the memory is subjected to heat is mooted by the soft ferromagnetic reference layer of the present invention because the orientation of magnetization is dynamically pinned-on-the-fly.

Another advantage of the magnetic memory cell of the present invention is that the magnitude of a current necessary to effectuate a read or a write operation is reduced so that power dissipation (waste heat) and power consumption are reduced. The current for the read or the write operation can be a static dc current or it can be a dynamic current pulse. As was mentioned previously, it is desirable to minimize power consumption and waste heat generation, particularly in portable battery operated systems and energy efficient systems.

In one embodiment of the present invention, the magnetic memory cell includes a ferromagnetic cap layer that is positioned between the ferromagnetic cladding and the intermediate layer and is magnetically coupled with the ferromagnetic cladding. During a read operation, the read magnetic field does not saturate and is substantially contained within the ferromagnetic cap layer and the ferromagnetic cladding. During a write operation, the first write magnetic filed saturates the thinner portion of the ferromagnetic cladding and the ferromagnetic cap layer and extends outward in a direction towards the ferromagnetic data layer. However, the first write magnetic field does not saturate the thicker portion of the ferromagnetic cladding.

In another embodiment of the present invention, the ferromagnetic data layer, the ferromagnetic cap layer and the ferromagnetic cladding can be made from a high magnetic permeability soft magnetic material. In yet another embodiment of the present invention, the ferromagnetic data layer, the ferromagnetic cap layer, and the ferromagnetic cladding are made from an identical high magnetic permeability soft magnetic material.

In one embodiment of the present invention, the ferromagnetic data layer, the ferromagnetic cap layer, and the ferromagnetic cladding can be made from a low coercivity material.

In alternative embodiments of the present invention, the magnetic memory cell can be a tunneling magnetoresistance memory cell or a giant magnetoresistance memory cell.

Other aspects and advantages of the present invention will become apparent from the following detailed description, taken in conjunction with the accompanying drawings, illustrating by way of example the principles of the present invention.

BRIEF DESCRIPTION OF THE DRAWINGS

FIG. 5 is an illustration of a magnetic memory cell with a soft ferromagnetic reference layer and a wholly clad read-write conductor according to the present invention.

FIG. 6 is an illustration of a magnetic field that is substantially contained within a ferromagnetic cladding during a read operation according to the present invention.

FIG. 7 is an illustration of a memory including an array of magnetic memory cells with a soft ferromagnetic reference layer and a wholly clad read-write conductor according to the present invention.

FIGS. 10a through 10f are an illustration of a method of making a magnetic memory cell with a soft ferromagnetic reference layer and a wholly clad read-write conductor according to the present invention.

DETAILED DESCRIPTION

Figure 1:
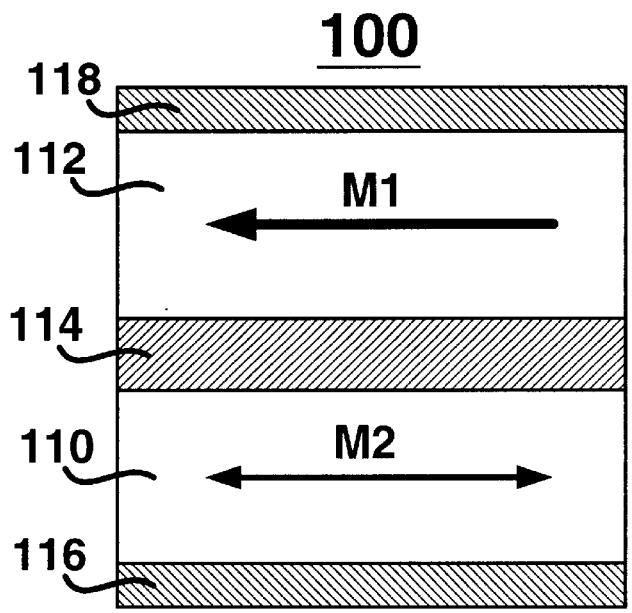
FIG. 1 is a prior magnetic memory cell with a reference layer having a pinned orientation of magnetization.
Figure 2A:
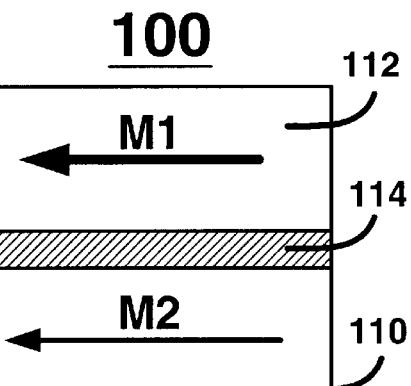
FIGS. 2a and 2b illustrate overall parallel and anti-parallel orientations of magnetization respectively between the reference layer and data layer of the prior magnetic memory cell of FIG.1.
Figure 2C:
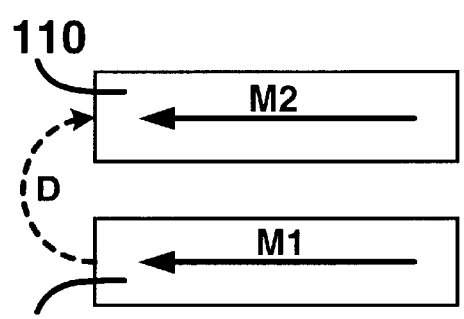
FIGS. 2c and 2d illustrate the effect of a demagnetization field on the orientation of magnetization of the data layer in a prior magnetic memory cell.
Figure 2B:
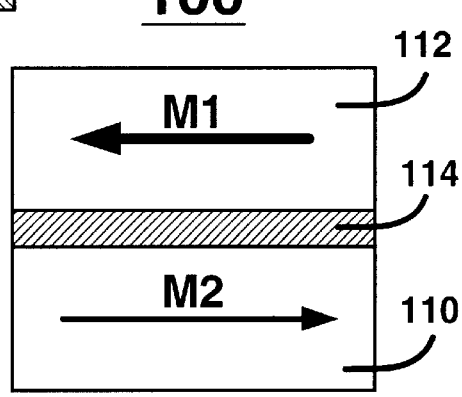
Figure 2D:
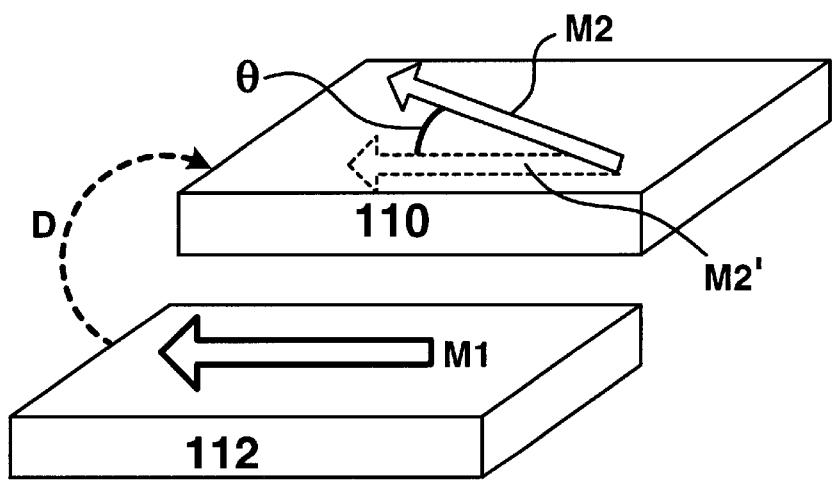
Figure 3B:
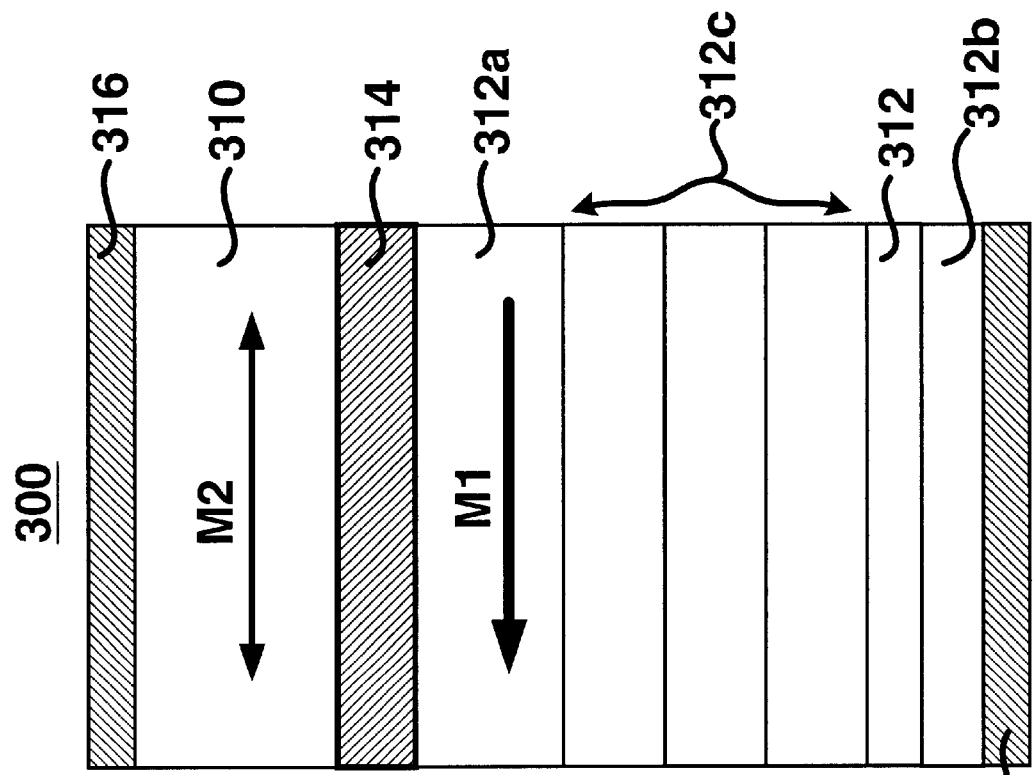
FIGS. 3a and 3b illustrate prior magnetic memory cells with multi-layer reference layers including a pinning layer and a pinned layer.
Figure 3A:
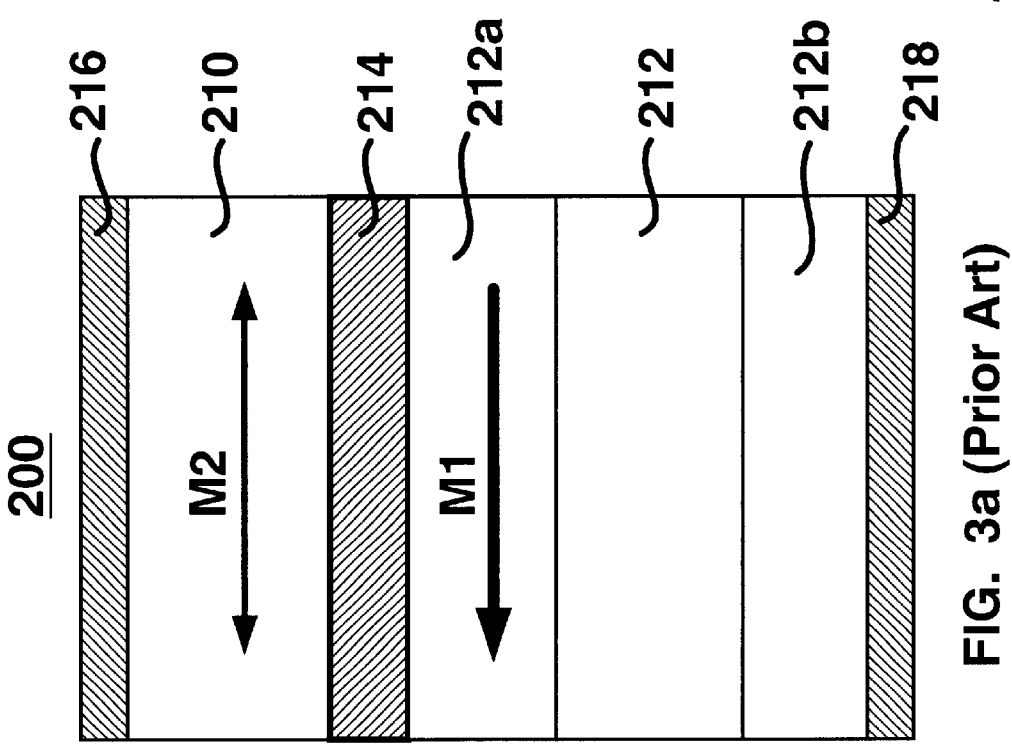
Figure 4B:
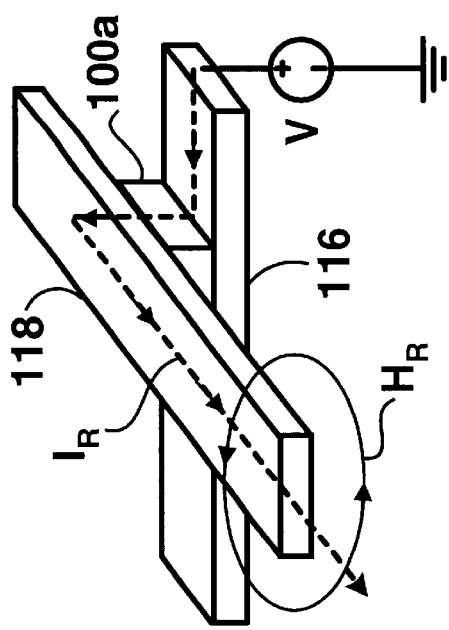
FIG. 4b illustrates a read operation to a selected prior magnetic memory cell and a magnetic field generated by a read current flowing in the row and column conductors.
Figure 4C:
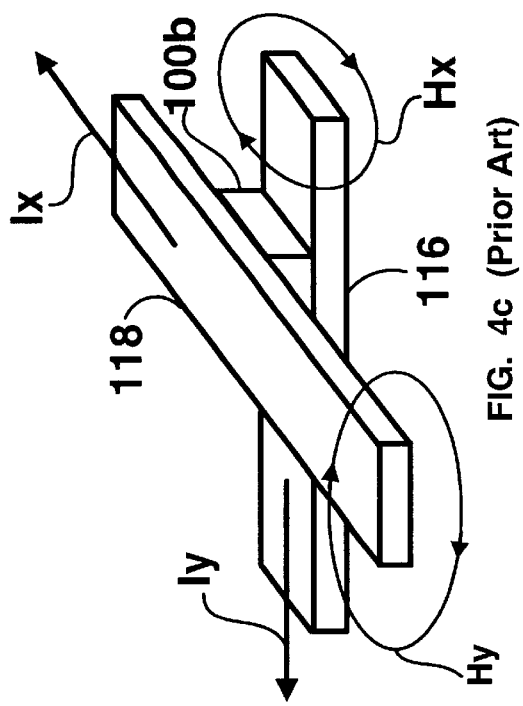
FIG. 4c illustrates a write operation to a selected prior magnetic memory cell and the fringe magnetic fields generated by currents flowing in the row and column conductors.
Figure 4A:
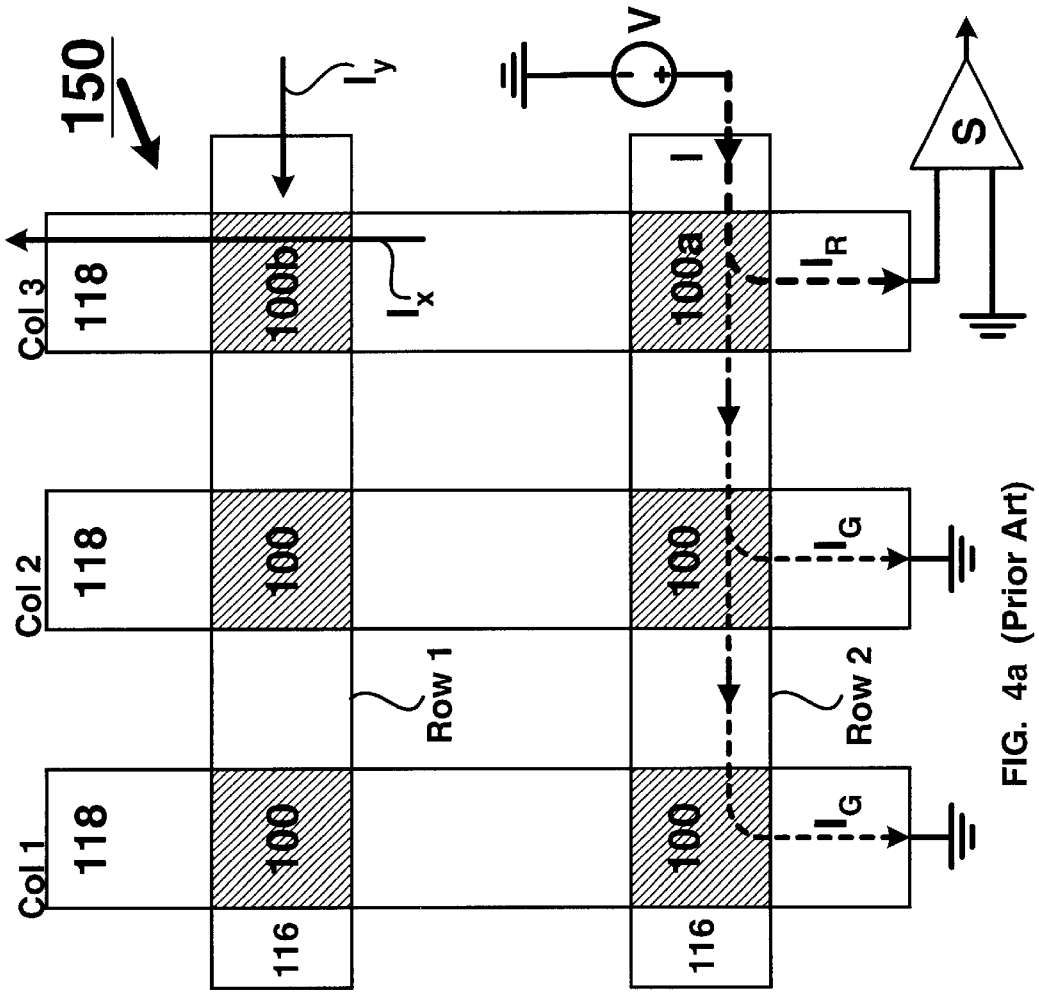
FIG. 4a is an illustration of a read operation and a write operation in a prior magnetic memory that includes an array of prior magnetic memory cells and row and column conductors.

In the following detailed description and in the several figures of the drawings, like elements are identified with like reference numerals.

As shown in the drawings for purpose of illustration, the present invention is embodied in a magnetic memory cell that includes a ferromagnetic data layer for storing a bit of data as an alterable orientation of magnetization, a first conductor in electrical communication with the ferromagnetic data layer, an intermediate layer in contact with the ferromagnetic data layer, and a soft ferromagnetic reference layer in contact with the intermediate layer and including a read-write conductor and a ferromagnetic cladding that completely surrounds the read-write conductor to form a cladded read-write conductor. The soft ferromagnetic reference layer has an orientation of magnetization that is not pinned in a predetermined direction. Hereinafter, that feature of the soft ferromagnetic reference layer shall be referred to as a "non-pinned orientation of magnetization".

The read-write conductor generates a read magnetic field in response to an externally supplied read current and the ferromagnetic cladding substantially contains the read magnetic field within the ferromagnetic cladding. Essentially, the ferromagnetic cladding provides a closed magnetic path (flux closure) around the read-write conductor. By passing a current of predetermined magnitude and direction through the read-write conductor, the resulting read magnetic field is strong enough to establish an orientation of magnetization in a known direction in the soft ferromagnetic reference layer such that the orientation of magnetization is dynamically pinned (i.e. the orientation of magnetization is pinned-on-the-fly). However, the read magnetic field is not strong enough to saturate the ferromagnetic cladding of the soft ferromagnetic reference layer such that the read magnetic field would extend substantially outward of the ferromagnetic cladding and potentially interfere with or overwrite the bit of data stored in the ferromagnetic data layer. The ferromagnetic cladding also substantially attenuates fringe fields that can interfere with or corrupt data stored in the ferromagnetic data layers of neighboring memory cells. The bit of data can be read by measuring a resistance between the soft ferromagnetic reference layer and the first conductor. The ferromagnetic cladding and the ferromagnetic data layer can be made from a high magnetic permeability soft magnetic material. The ferromagnetic cladding has a tailored thickness that is designed to insure that the read magnetic field is substantially contained within the ferromagnetic cladding. However, the tailored thickness includes a thinner portion along a portion of the ferromagnetic cladding that is in contact with the intermediate layer so that during a write operation a first write current is passed through the read-write conductor to generate a first write magnetic field that saturates the ferromagnetic cladding along the thinner portion and extends outward of the ferromagnetic cladding in a direction towards the ferromagnetic data layer to write a new bit of data to the ferromagnetic data layer. Moreover, the aforementioned tailored thickness of the ferromagnetic cladding includes a thicker portion along those portions of the ferromagnetic cladding that are not in contact with the intermediate layer.

Optionally, the magnetic memory cell of the present invention can include a ferromagnetic cap layer positioned between the intermediate layer and the ferromagnetic cladding. The ferromagnetic cap layer is magnetically coupled with the ferromagnetic cladding so that the read magnetic field is substantially contained within the ferromagnetic cladding and the ferromagnetic cap layer during a read operation. Essentially, the ferromagnetic cladding and the ferromagnetic cap layer become magnetically as one, and together, the ferromagnetic cladding and the ferromagnetic cap layer provide a closed magnetic path (flux closure) around the read-write conductor.

On the other hand, the first write magnetic field saturates the thinner portion of the ferromagnetic cladding that is in contact with the ferromagnetic cap layer. As a result of that saturation, the first write magnetic field extends outward of the thinner portion of the ferromagnetic cladding and the cap layer and in a direction towards the ferromagnetic data layer to write a new bit of data to the ferromagnetic data layer during a write operation. As was mentioned above, the ferromagnetic cladding has a thicker portion that is not in contact with the ferromagnetic cap layer. The soft ferromagnetic reference layer of the present invention is called a "reference layer" because the direction of orientation of magnetization can be dynamically set (i.e. it is dynamically pinned) to a known direction by an externally supplied current. It is called "soft" because the magnetic materials used are magnetically soft and are not the usual hard-pinned materials (e.g. anti-ferromagnet systems such as NiFe/IrMn or others).

Advantages of the magnetic memory cell of the present invention include the cladded read-write conductor that solves the fringe field problem by substantially containing the read magnetic field generated by the read-write conductor within the ferromagnetic cladding of the soft ferromagnetic reference layer during a read operation so that the data stored in neighboring magnetic memory cells are not corrupted by stray magnetic fields, the soft ferromagnetic reference layer eliminates the need to form a pinned reference layer with its concomitant complex layers of materials and additional fabrication steps that can lead to reduced yield and higher manufacturing costs, the need to anneal the magnetic memory cell is eliminated, and the magnitude of current (i.e a dc current or a pulse current) necessary to read or write the bit of data is reduced with an accompanying reduction in power dissipation and power consumption.

An additional advantage of the magnetic memory cell of the present invention is that the ferromagnetic cladding provides flux closure during a read operation so that a demagnetization field that could cause an angular displacement of the orientation of magnetization in the ferromagnetic data layer is significantly reduced or eliminated. Consequently, during the read operation, there is a higher magnitude of change in magnetoresistance resulting in a higher signal-to-noise ratio (S/N) between logic states (i.e. a logic "0" or a logic "1") that make those logic states easier to detect.

The structure set forth herein for the magnetic memory cell of the present invention is valid for several forms of magnetic memory including but not limited to TMR and GMR-based magnetic memory cells. Although the materials and the structures used for those forms of magnetic memory differ and the physical effects used to detect the different states of the reference layer and the ferromagnetic data layer (i.e. parallel or anti-parallel) also differ, the magnetic design of those forms of magnetic memory are the same. So long as at least a pair of conductors is required to rotate the orientation of magnetization of the ferromagnetic data layer and a read-write conductor is required to measure the resistance between the ferromagnetic data layer and the reference layer, the magnetic memory cell of the present invention will work just as well for a variety of magnetic memories including those recited above. It will be clearly understood by those skilled in the magnetic memory art that the magnetic memory cell of the present invention can also be implemented in an array of magnetic memory cells to form a data storage device (i.e. a memory) such as a MRAM. The structure of the memory array will depend on the type of memory cell. For example, a crosspoint memory structure is well suited to an array of TMR memory cells.

In FIG. 5, a magnetic memory cell 10 includes a ferromagnetic data layer 11 for storing a bit of data as an alterable orientation of magnetization M2 (in the magnetic memory cell art, the ferromagnetic data layer 11 is also referred to as a storage layer or a bit layer), a first conductor 29 in electrical communication with the ferromagnetic data layer 11, an intermediate layer 13 in contact with the ferromagnetic data layer 11, a ferromagnetic cap layer 15 in contact with the intermediate layer 13, and a soft ferromagnetic reference layer 17 in contact with the ferromagnetic cap layer 15 and having a non-pinned orientation of magnetization and including a read-write conductor 19 and a ferromagnetic cladding 21 that completely surrounds the read-write conductor 19 to form a cladded read-write conductor (i.e. the read-write conductor 19 is wholly clad on all of its sides by the ferromagnetic cladding 21). The soft ferromagnetic reference layer 17 is in contact with the ferromagnetic cap layer 15 along a portion of the ferromagnetic cladding 21 as show by dashed arrows 16 (hereinafter the ferromagnetic cladding 21 shall be referred to as the cladding 21 and the ferromagnetic cap layer 15 shall be referred to as the cap layer 15). The cladding 21 and the cap layer 15 need not have edges that are flush with each other as illustrated in FIG. 5. For instance, the edges of one may overlap by or be inset from the edges of the other.

Furthermore, the cladding 21 has a tailored thickness that includes a thinner portion (see arrows 16) along a portion of the cladding 21 that is in contact with the cap layer 15 and a thicker portion along those portions of the cladding 21 that are not in contact with the cap layer 15. Additionally, the orientation of magnetization of the soft ferromagnetic reference layer 17 is not pinned, that is, the soft ferromagnetic reference layer 17 does not have a predetermined orientation of magnetization that is set during fabrication of the magnetic memory cell 10 using a prior process such as annealing in a magnetic field, for example.

Instead, in FIG. 6, an externally supplied read current $I_R$ of a predetermined magnitude and direction is passed through the read-write conductor 19 resulting in the generation of a read magnetic field $H_R$. In FIG. 6, the read current $I_R$ is flowing into the page as indicated by the "+" symbol such that the read magnetic field $H_R$ has a vector in a clockwise direction in accordance with the right-hand rule. The read magnetic field $H_R$ is substantially contained within the cladding 21. As a result of the read magnetic field $H_R$, the soft ferromagnetic reference layer 17 has an orientation of magnetization M1 that is dynamically pinned (i.e. it is pinned-on-the-fly) with M1 pointing to the left. The orientation of magnetization M1 remains dynamically pinned so long as the current $I_R$ continues to flow through the read-write conductor 19. While the read current $I_R$ is flowing, a resistance exists between the ferromagnetic data layer 11 and the soft ferromagnetic reference layer 17 due to electrons that flow between the ferromagnetic data layer 11 and the soft ferromagnetic reference layer 17 through the intermediate layer 13. The state of the bit of data stored in the ferromagnetic data layer 11 can be determined by measuring the magnitude and/or change in that resistance. For example, the resistance can be measured between the soft ferromagnetic reference layer 17 and the first conductor 29.

In FIG. 6, the magnetic memory cell 10 does not include the cap layer 15 (see FIG. 5). However, as will be discussed in reference to FIGS. 8a through 9b, the principles discussed above in FIG. 6 in reference to the soft ferromagnetic reference layer 17 of the present invention apply whether or not the magnetic memory cell 10 includes the cap layer 15. The cap layer 15 is optional. When the cap layer 15 is present (see FIGS. 8a through 9b), the read magnetic field $H_R$ is substantially contained within the cladding 21 and the cap layer 15 because the cladding 21 and the cap layer 15 are both made from ferromagnetic materials and become magnetically as one when in contact with each other.

The phenomenon that causes the resistance is well understood in the magnetic memory art and is also well understood for TMR, GMR, and CMR memory cells. For instance, in a TMR-based memory cell, the phenomenon is referred to as quantum mechanical tunneling or spin-dependent tunneling. In the TMR memory cell, the intermediate layer 13 is a thin tunnel barrier layer of dielectric material through which electrons quantum mechanically tunnel (i.e. migrate) between the ferromagnetic data layer 11 and the soft ferromagnetic reference layer 17. On the other hand, in a GMR-based memory cell, the phenomena is spin-dependent scattering of electrons and the intermediate layer 13 is a thin spacer layer of non-magnetic material. In either case, the resistance between the ferromagnetic data layer 11 and the soft ferromagnetic reference layer 17 varies depending on the relative orientations of M1 and M2 and it is that variation in resistance that can be sensed to determine if the bit of data stored in the ferromagnetic data layer 11 is a logic "0" or a logic "1".

Accordingly, the bit of data stored in the ferromagnetic data layer 11 can be read during a read operation to the magnetic memory cell 10 by passing the read current $I_R$ through the read-write conductor 19 as described above and then measuring a resistance between the ferromagnetic data layer 11 and the soft ferromagnetic reference layer 17. The logic state of the bit (i.e. a logic "0" or a logic "1") can be determined by sensing the magnitude of the resistance. An example of how the logic state of the bit can be determined from the relative orientations of M1 and M2 will now be explained in reference to FIGS. 8a and 8b and FIGS. 9a and 9b.

Figure 8A:
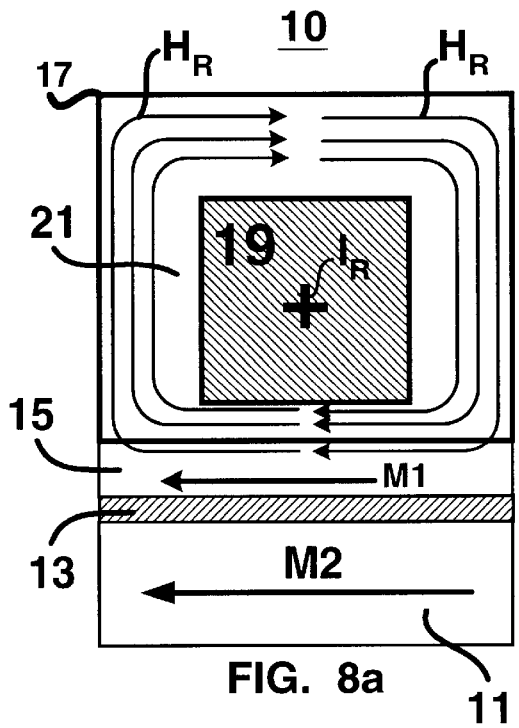
FIGS. 8a through 9b are an illustration of a soft ferromagnetic reference layer that is pinned-on-the-fly during a read operation according to the present invention.

In FIG. 8a, the read current $I_R$ is flowing into the page as indicated by the "+" symbol such that the read magnetic field $H_R$ has a vector in a clockwise direction and the pinned-on-the-fly orientation of magnetization M1 of the soft ferromagnetic reference layer 17 is parallel to the alterable orientation of magnetization M2 of the ferromagnetic data layer 11, that is, M1 and M2 point in the same direction. That arrangement of M1 and M2 can result in a resistance between the ferromagnetic data layer 11 and the soft ferromagnetic reference layer 17 that can be predetermined to represent a logic "0".

Figure 8B:
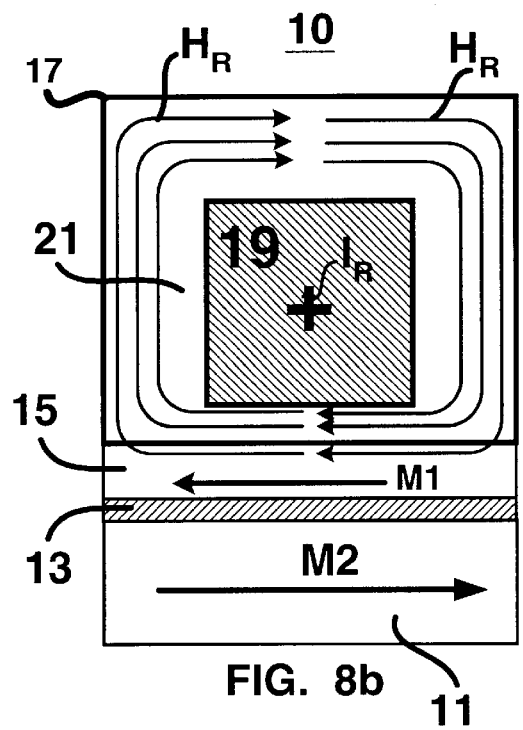

On the other hand, in FIG. 8b, the alterable orientation of magnetization M2 of the ferromagnetic data layer 11 is anti-parallel to the pinned-on-the-fly orientation of magnetization M1 of the soft ferromagnetic reference layer 17, that is, M1 and M2 point in opposite directions. Consequently, that arrangement of M1 and M2 can result in a resistance between the ferromagnetic data layer 11 and the soft ferromagnetic reference layer 17 that can be predetermined to represent a logic "1".

Figure 9A:
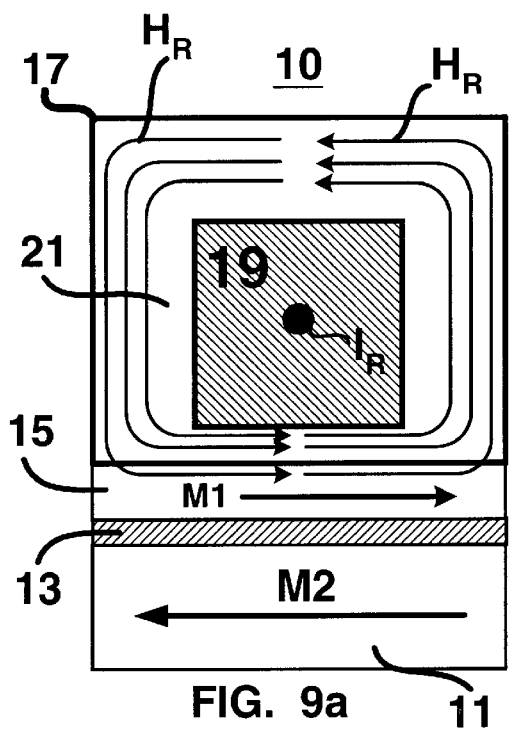

As a further example, in FIG. 9a, the read current $I_R$ is flowing out of the page as indicated by the "●" symbol and the pinned-on-the-fly orientation of magnetization M1 of the soft ferromagnetic reference layer 17 is anti-parallel to the alterable orientation of magnetization M2 of the ferromagnetic data layer 11. Additionally, the read magnetic field $H_R$ has a vector in a counter clockwise direction such that M1 points to the right. That arrangement of M1 and M2 can result in a resistance between the ferromagnetic data layer 11 and the soft ferromagnetic reference layer 17 that can be predetermined to represent a logic "1".

Figure 9B:
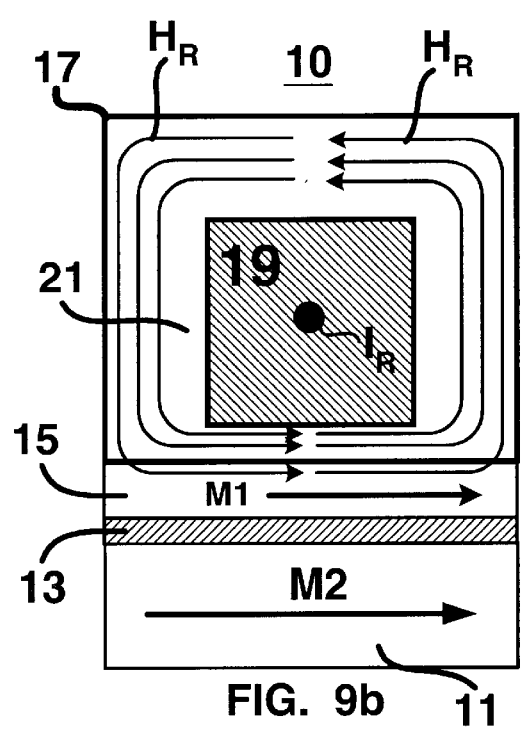

Conversely, in FIG. 9b, the alterable orientation of magnetization M2 of the ferromagnetic data layer 11 is parallel to the pinned-on-the-fly orientation of magnetization M1 of the soft ferromagnetic reference layer 17. Consequently, that arrangement M1 and M2 can result in a resistance between the ferromagnetic data layer 11 and the soft ferromagnetic reference layer 17 that can be predetermined to represent a logic "0".

As was mentioned previously, the principles of the read operation illustrated in FIGS. 8a through 9b apply whether or not the cap layer 15 is present. The inclusion or exclusion of the cap layer 15 will be discussed below in connection with a method for making the memory cell 10 of the present invention. Furthermore, when the cap layer 15 is present, it is magnetically as one (i.e. it is magnetically coupled) with the cladding 21 such that the read magnetic field $H_R$ extends into the cap layer 15 as illustrated in FIGS. 8a through 9b. Therefore, the cap layer 15 as illustrated in FIGS. 8a through 9b is optional. The cap layer 15 can be excluded and the principles of the read operation as discussed in reference to FIGS. 8a through 9b still apply.

The determination of which logic state is assigned to the parallel and anti-parallel relationship between M1 and M2 can be application dependent or the determination can be made via a predetermined convention. For example, the arrangement illustrated in FIGS. 8a and 8b can be adopted as the convention, whereby the read current $I_R$ flows into the page "+" so that M1 is pinned-on-the-fly to a desired orientation (i.e. pointing to the left) and the convention for a logic "0" is M1 and M2 parallel, and the convention for a logic "1" is M1 and M2 anti-parallel.

In the embodiments of the present invention described herein, the ferromagnetic data layer 11, the cap layer 15, and the cladding 21 can be made from a high magnetic permeability soft magnetic material. A "soft magnetic material" means a material having a high relative magnetic permeability $\mu_R$ of about 1000 or more (i.e. the magnetic permeability $\mu$ is: $\mu=\mu_0*\mu_R$; where $\mu_0=4\pi*10^{-7}$ H/m; and $\mu=(4\pi*10^{-7})*1000=1.257*10^{-3}$ H/m or more) and a low coercive force (coercivity) of about 1000 A/m or less and a small hysteresis loss.

The high magnetic permeability soft magnetic material for the cladding 21 allows the orientation of magnetization M1 to be pinned-on-the-fly with a magnitude of the read magnetic field $H_R$ that does not saturate the cladding 21 such that the read magnetic field $H_R$ is substantially contained within the cladding 21. Moreover, any portion of the read magnetic field $H_R$ that extends outward of the cladding 21 (i.e. is not contained within cladding 21) does not rotate the alterable orientation of magnetization M2 in the ferromagnetic data layer 11 (that is, the read magnetic field $H_R$ does not switch M2 from its current orientation). As a result, a magnitude of the read current $I_R$ that is required to produce the read magnetic field H is reduced over prior magnetic memory cells. Similarly, if the soft ferromagnetic reference layer 17 includes the cap layer 15, then high magnetic permeability soft magnetic material for both the cladding 21 and the cap layer 15 allow the orientation of magnetization M1 to be pinned-on-the-fly with a magnitude of the read magnetic field $H_R$ that does not saturate the cladding 21 and the cap layer 15 such that the read magnetic field $H_R$ is substantially contained within the cladding 21 and the cap layer 15, and any portion of the read magnetic field H that extends outward of the cladding 21 and the cap layer 15 does not rotate the alterable orientation of magnetization M2 in the ferromagnetic data layer 11.

In contrast, the high magnetic permeability soft magnetic material for the cladding 21 allows a first write magnetic field $H_{W1}$ generated by a first write current $I_{W1}$ flowing in the read-write conductor 19 to saturate the cladding 21 so that the first write magnetic field $H_{W1}$ extends outward of the cladding 21 to the ferromagnetic data layer 11. If the cap layer 15 is present, then the first write magnetic field $H_{W1}$ saturates both the cladding 21 and the cap layer 15 and extends outward to the ferromagnetic data layer 11. In either case, the thinner portion of the cladding is operative to support saturation of the cladding during a write operation where the magnitude of the first write current $I_{W1}$ is sufficient to generate a saturating magnetic field, i.e. the first write magnetic field $H_{W1}$.

In one embodiment of the present invention, the high magnetic permeability soft magnetic material for any selected one or more of the ferromagnetic data layer 11, the cap layer 15, and the cladding 21 can be made from a material that includes but is not limited to those enumerated in Table 1 below.

TABLE 1

| Materials for: the ferromagnetic data layer 11; the cap layer 15; and the cladding 21 |
| --- |
| Nickel Iron (NiFe) |
| An Alloy of Nickel Iron (NiFe) |
| Nickel Iron Cobalt (NiFeCo) |
| An Alloy of Nickel Iron Cobalt (NiFeCo) |
| Cobalt iron (CoFe) |
| An Alloy of Cobalt Iron (CoFe) |
| PERMALLOY ™ |

In another embodiment of the present invention, the ferromagnetic data layer 11, the cap layer 15, and the cladding 21 can be made from identical high magnetic permeability soft magnetic materials. The identical high magnetic permeability soft magnetic materials include but are not limited to those set forth in Table 1 above. For example, Nickel Iron (NiFe) or PERMALLOY™ can be used to make the ferromagnetic data layer 11, the cap layer 15, and the cladding 21.

In one embodiment of the present invention, any selected one or more of the ferromagnetic data layer 11, the cap layer 15, and the cladding 21 has a relative magnetic permeability greater than about 1000.

In yet another embodiment of the present invention, any selected one or more of the ferromagnetic data layer 11, the cap layer 15, and the cladding 21 has a coercivity of about 1000 A/m or less.

The read-write conductor 19 can be made from an electrically conductive material. Suitable materials for the read-write conductor 19 include but are not limited to those enumerated in Table 2 below.

TABLE 2

| Materials for the read-write conductor 19 |
| --- |
| Copper (Cu) |
| An Alloy of Copper (Cu) |
| Aluminum (Al) |
| An Alloy of Aluminum (Al) |
| Aluminum Copper (AlCU) |
| An Alloy of Aluminum Copper (AlCu) |
| Tantalum (Ta) |
| An Alloy of Tantalum (Ta) |
| Gold (Au) |
| An Alloy of Gold (Au) |
| Silver (Ag) |
| An Alloy of Silver (Ag) |

In one embodiment of the present invention, the intermediate layer 13 is a tunnel barrier layer made from an insulating material (i.e. it is not electrically conductive) that separates and electrically isolates the ferromagnetic data layer 11 from the soft ferromagnetic reference layer 17. A dielectric material including but not limited to those enumerated in Table 3 below can be used for the tunnel barrier layer. The tunnel barrier layer can have a thickness (see $T_3$ in FIG. 13) that is from about 0.5 nm to about 5.0 nm.

TABLE 3

| Materials for the tunnel barrier layer |
| --- |
| Silicon Oxide (SiO$_2$) |
| Silicon Nitride (SiN$_x$) |

TABLE 3-continued

Materials for the tunnel barrier layer

Magnesium Oxide (MgO)
Aluminum Oxide (Al$_2$O$_3$)
Aluminum Nitride (AlN$_x$)
Tantalum Oxide (TaO$_x$)

In another embodiment of the present invention, the intermediate layer 13 is a spacer layer made from a non-magnetic material. The non-magnetic material for the space layer can be a 3d, 4d, or 5d transition metal (from the periodic table of the elements). A non-magnetic material including but not limited to those enumerated in Table 4 below can be used for the space layer. The spacer layer can have a thickness (see T$_3$ in FIG. 13) that is from about 0.5 nm to about 5.0 nm.

TABLE 4

Materials for the space layer

Copper (Cu)
Gold (Au)
Silver (Ag)

Figure 11:
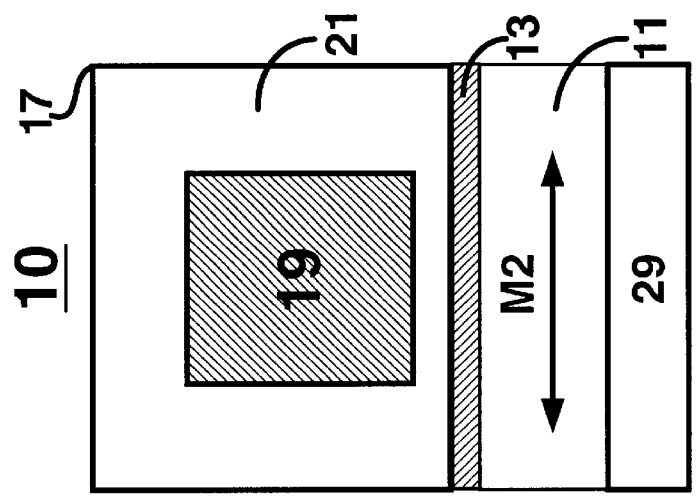
FIG. 11 is an illustration of a magnetic memory cell with a soft ferromagnetic reference layer and including a first conductor for writing a bit of data to a ferromagnetic data layer according to the present invention.

In FIG. 11, the magnetic memory cell 10 of the present invention can include a first conductor 29 that crosses the ferromagnetic data layer 11 and is in electrical communication with the ferromagnetic data layer 11. The electrical communication between the ferromagnetic data layer 11 and the first conductor 29 can be accomplished by the first conductor 29 and the ferromagnetic data layer 11 being in contact with each other or by an interconnect structure such as a via, a conductive plug, or the like (not shown). Preferably, the first conductor 29 is in contact with the ferromagnetic data layer 11 because that arrangement is compact and is less complicated than an interconnect structure. The bit of data can be read as described above by measuring a resistance between the first conductor 29 and the soft ferromagnetic reference layer 17. The first conductor 29 can cross the ferromagnetic data layer 11 in a substantially orthogonal direction or the first conductor 29 can cross the ferromagnetic data layer 11 in a non-orthogonal direction. Typically, the first conductor 29 crosses the ferromagnetic data layer 11 in an orthogonal direction because microelectronic layout and routing tools are amendable to orthogonal layout of microelectronic devices and some tools will not permit a non-orthogonal layout. The first conductor 29 can be made from an electrically conductive material including but not limited to those set forth in Table 2 above.

In FIG. 7, a memory 50 is formed by a plurality (three are shown) of the magnetic memory cells 10 of the present invention. Each magnetic memory cell 10 has its respective cap layer 15 (the cap layer 15 is optional) in contact with a common soft ferromagnetic reference layer 17 and each magnetic memory cell 10 stores a bit of data in its respective ferromagnetic data layer 11. The bit of data can be read by measuring a resistance between the ferromagnetic data layer 11 and the soft ferromagnetic reference layer 17. Additionally, as was discussed above in reference to FIG. 11, each magnetic memory cell 10 can include a first conductor 29 that is in electrical communication with its respective ferromagnetic data layer 11. Similarly, the bit of data can be read by measuring a resistance between the first conductor 29 and the soft ferromagnetic reference layer 17. Accordingly, the soft ferromagnetic reference layer 17 and the first conductor 29 can be a pair of conductors such as a row conductor and a column conductor respectively, or a column conductor and a row conductor respectively. The pair of conductors intersect each other and the magnetic memory cells 10 can be positioned at an intersecting region between the pair of conductors as illustrated in FIG. 7. The pair of conductors need not intersect each other in an orthogonal direction.

As is well understood in the art, a write operation in which a bit of data is written to the ferromagnetic data layer 11 can be accomplished by passing a first externally supplied current I$_{W1}$ through the read-write conductor 19 to generate a first write magnetic field H$_{W1}$ and by passing a second externally supplied current I$_{W2}$ through the first conductor 29 to generate a second write magnetic field H$_{W2}$. The first and second write magnetic fields (H$_{W1}$ H$_{W2}$) cooperatively interact with the ferromagnetic data layer 11 to rotate the alterable orientation of magnetization M2 to a desired orientation. For instance, if the ferromagnetic data layer 11 is currently storing a logic "0" with M2 pointing to the "left", then the first and second write magnetic fields (H$_{W1}$, H$_{W2}$) can cooperatively interact with the ferromagnetic data layer 11 to rotate (i.e. flip) M2 to the "right" so that a logic "1" is written to the ferromagnetic data layer 11.

Figure 12:
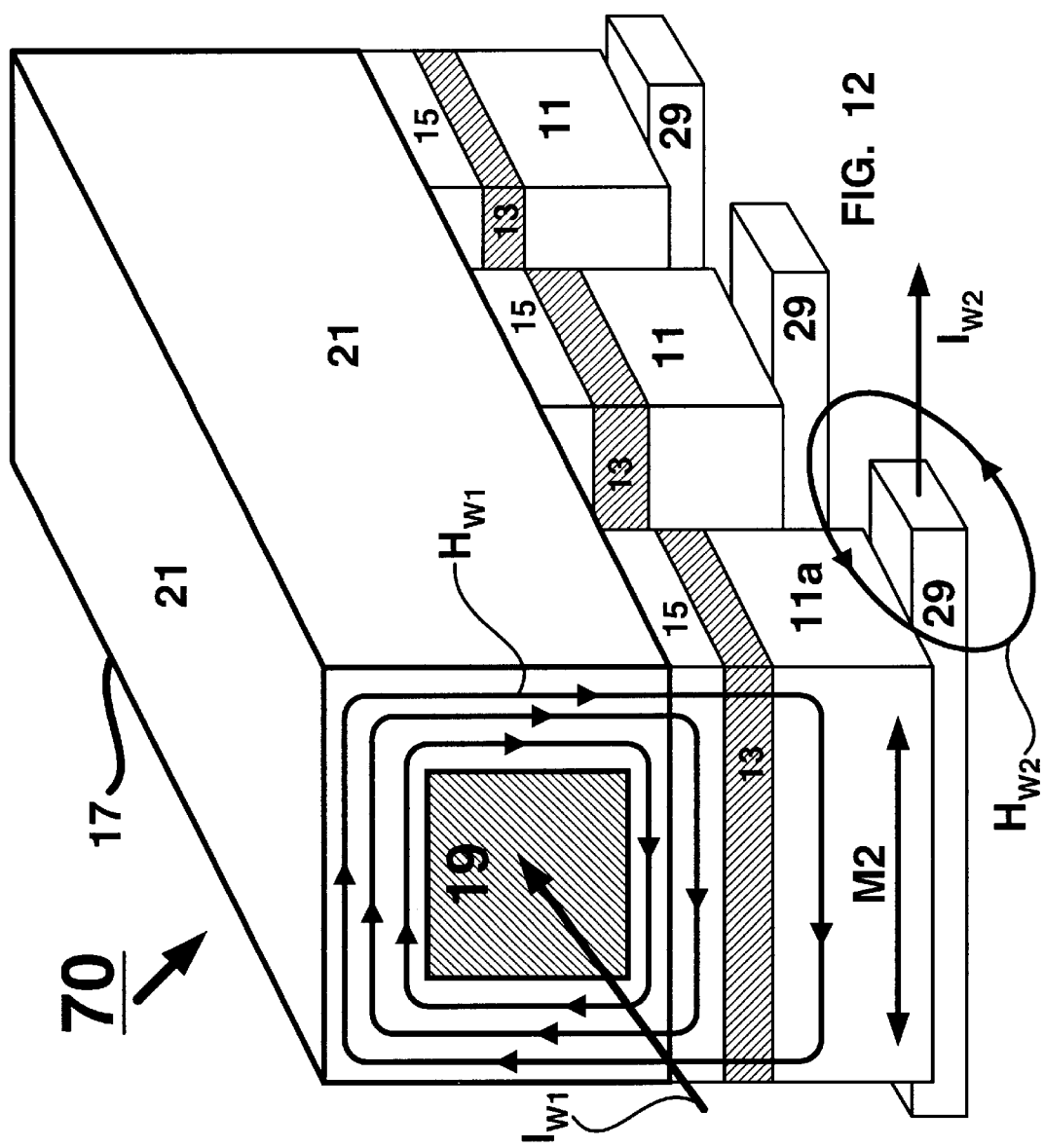
FIG. 12 is an illustration of a memory including an array of magnetic memory cells with a soft ferromagnetic reference layer and a first conductor for writing a bit of data to a ferromagnetic data layer of a selected magnetic memory cell according to the present invention.

In FIG. 12, a memory 70 is formed by a plurality (three are shown) of the magnetic memory cells 10 of the present invention. Each magnetic memory cell 10 has its respective cap layer 15 (the cap layer 15 is optional) in contact with a common soft ferromagnetic reference layer 17 and its respective ferromagnetic data layer 11 is in electrical communication with a first conductor 29 that crosses the ferromagnetic data layer 11.

A write operation to a selected one of the magnetic memory cells 10 can be accomplished as follows. The magnetic memory cell 10 with a ferromagnetic data layer denoted as 11a is selected for a write operation by passing the first write current I$_{W1}$ through the read-write conductor 19 and by passing the second write current I$_{W2}$ through the first conductor 29. The other magnetic memory cells 10 are not selected for a write operation because no write currents are flowing in their respective first conductors 29. The first write current I$_{W1}$ generates a first write magnetic field H$_{W1}$ and the second write current I$_{W2}$ generates a second write magnetic field H$_{W2}$. The first and second write magnetic fields (H$_{W1}$, H$_{W2}$) cooperatively interact to rotate the alterable orientation of magnetization M2 in ferromagnetic data layer 11a to a desired orientation.

As a further example, a read operation to the same ferromagnetic data layer 11a can be accomplished by passing a read current I$_R$ of predetermined magnitude and direction through the read-write conductor 19 of the soft ferromagnetic reference layer 17. The read current I$_R$ generates a read magnetic field H$_R$ that is substantially contained within the cladding 21 and the read magnetic field H$_R$ is operative to pin-on-the-fly the orientation of magnetization M1. The bit of data stored in the ferromagnetic data layer 11a can be read by measuring a resistance between the soft ferromagnetic reference layer 17 and the first conductor 29 of ferromagnetic data layer 11a (see FIG. 7).

Figure 14A:
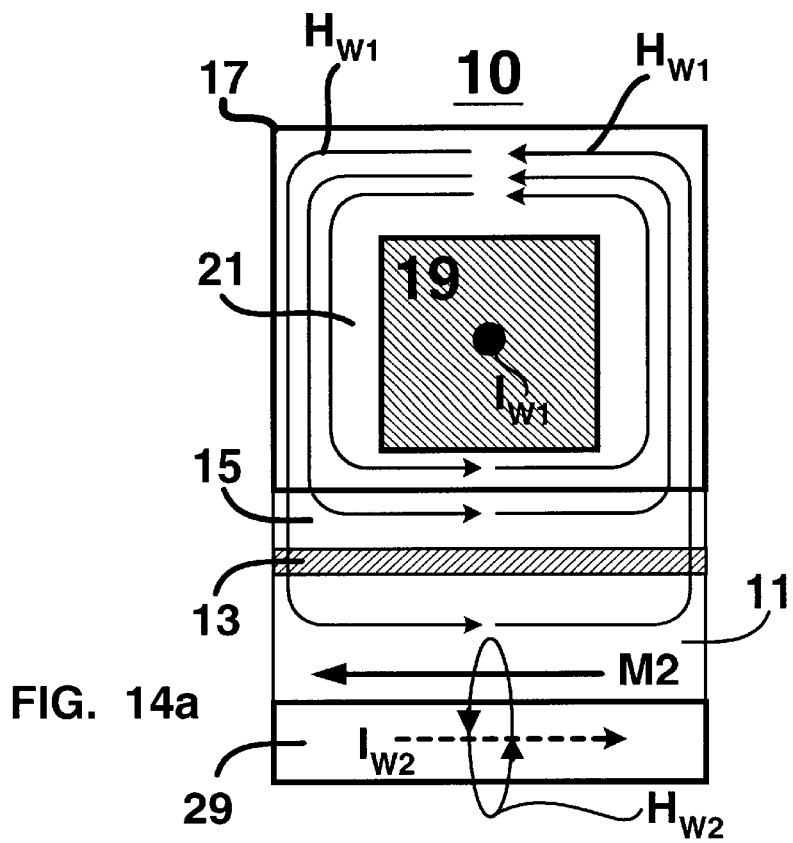
FIGS. 14a and 14b are an illustration of a write operation and switching fields that rotate the alterable orientation of magnetization of a ferromagnetic data layer according to the present invention.
Figure 14B:
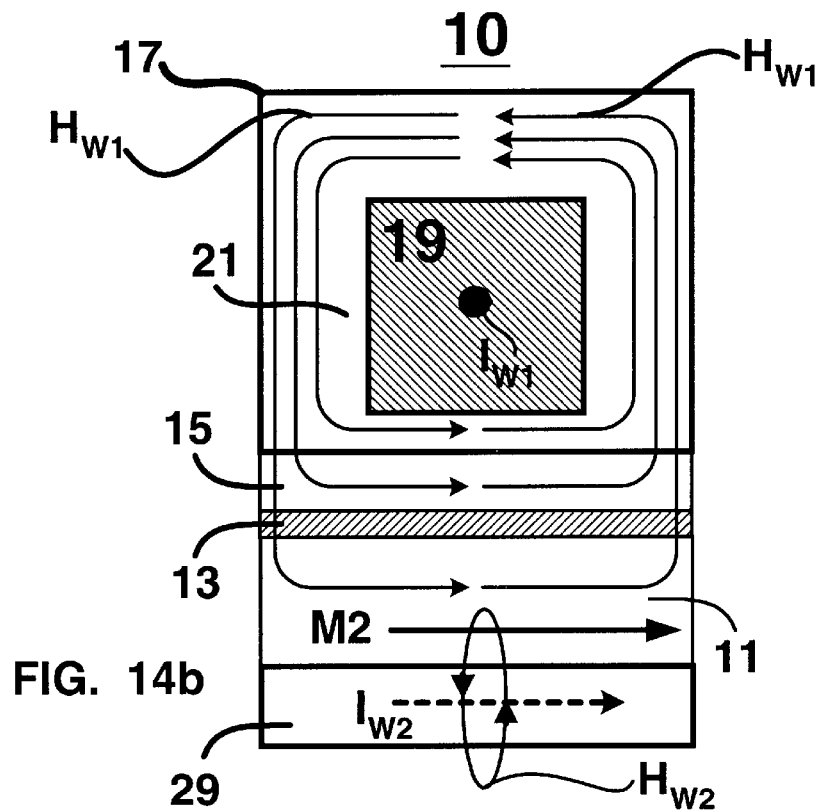

In FIGS. 14a and 14b, the write operation is illustrated in greater detail. In FIG. 14a, the alterable orientation of magnetization M2 is pointing to the left at the beginning of the write operation. The first and second write magnetic fields (H$_{W1}$, H$_{W2}$) extend to the ferromagnetic data layer 11 and acting together, the first and second write magnetic fields (H$_{W1}$, H$_{W2}$) begin to rotate M2. The magnitude of the first write current $I_{W1}$ (see dashed arrows) is such that the first write magnetic field $H_{W1}$ saturates the cladding 21 and the cap layer 15 (along the thinner portion) such that the first write magnetic field $H_{W1}$ extends into the ferromagnetic data layer 11. Next, in FIG. 14b, the alterable orientation of magnetization M2 has been rotated and is pointing to the right as a result of the combined magnetic forces of the first and second write magnetic fields ($H_{W1}$, $H_{W2}$) acting on M2. If M2 represented a logic "0" when it pointed to the left, then M2 pointing to the right represents a logic "1".

A process for making the cladded read-write conductor of present invention is illustrated in FIGS. 10a thorough 10f. The order of the process steps set forth below is an example only, the actual order of process steps need not be in the same order as set forth below. Furthermore, other processes known to those skilled in the microelectronics art can be used in place of those set forth herein.

First, in FIG. 10a, a dielectric layer 31 is formed and then planarized by a process such as chemical mechanical planarization (CMP), for example. A trench 33 is etched in the dielectric layer 31 prior to depositing a high magnetic permeability soft magnetic material that will form a portion of the cladding 21. Although only a portion of the dielectric layer 31 is illustrated in FIG. 10a, the dielectric layer 31 can be a dielectric layer having a plurality of the trenches 33 formed therein and the dielectric layer 31 can extend beyond what is illustrated as shown by dashed arrows e.

Second, in FIG. 10b, a portion of the cladding 21a is deposited in the trench 33 using an isotropic process (so that side walls S of the trench 33 are coated to roughly the same thickness as a bottom b of the trench 33). The material used for the cladding 21a is a magnetically soft material, i.e. it is permeable enough to act as a magnetic core and is continuous throughout its cross-section without any breaks or too many voids. A trench 35 is formed as a result of the isotropic deposition of the cladding 21a.

Third, in FIG. 10c, the trench 35 is filled with an electrically conductive material such as copper (Cu) using electroplating or other suitable deposition process to form the read-write conductor 19. The entire structure is then planarized (using CMP for example) to achieve the structure illustrated in FIG. 10c. Note, that in FIG. 10c the read-write conductor 19 is not yet wholly clad.

Fourth, in FIG. 10b, another high magnetic permeability soft magnetic material 21b is deposited to close the magnetic flux path thereby forming a wholly clad read-write conductor 19 (i.e. it is completely surrounded by cladding segments 21a, and 21b). The thickness of the high magnetic permeability soft magnetic material 21b can be made to be different than the thickness of the bottom b or the sidewalls S of the cladding 21a. The material for 21b can be the same or different than that of the material for the cladding 21a. The cladding 21b is then patterned and etched, followed by the remainder of the magnetic memory cell 10 being formed on top of the structure of FIG. 10d. Additionally, it should be noted that although FIG. 10d illustrates the high magnetic permeability soft magnetic material 21b extending beyond the outermost edges of the cladding 21a, the high magnetic permeability soft magnetic material 21b can be flush with those edges or it can be inset from those edges as shown by dashed lines i. The high magnetic permeability soft magnetic material 21b should not be so far inset i that it no longer forms a closed flux path with the cladding 21a.

Optionally, in FIG. 10e, another high magnetic permeability soft magnetic material may be deposited on the cladding 21 (formerly denoted as 21a and 21b) to form the cap layer 15. The intermediate layer 13 is then deposited on the cap layer 15. The inclusion of the cap layer 15 can be a matter of manufacturing choice. For instance, as was mentioned above, the process steps need not follow the order set forth herein. To that end, it may be that the magnetic memory cell 10 is fabricated starting with the ferromagnetic data layer 11 followed by the intermediate layer 13 and so forth. Depending on the material used for the intermediate layer 13, it may be necessary to cap off (i.e passivate) the intermediate layer 13 to prevent it from chemically reacting with an environment it is exposed to after it has been deposited. For example, if the intermediate layer 13 is a dielectric tunnel barrier layer, then it may be desirable to deposit a cap layer 15 that is made from a high magnetic permeability soft magnetic material that will be magnetically compatible with the high magnetic permeability soft magnetic material of the cladding 21. The cap layer 15 serves as a protective cap for the dielectric tunnel barrier layer. The cap layer 15 can be made from the same material as the cladding 21 or from a different material than the cladding 21.

Finally, in FIG. 10f, the ferromagnetic data layer 11 is formed on the intermediate layer 13. Additionally, an electrically conductive material can be deposited on the ferromagnetic data layer 11 to form the first conductor 29.

The process described above mimics that of a Cu-damascene process used to form the wholly clad read-write conductor (i.e. 19, 21a, and 21b) of the present invention. The planar structures that such a process produces are beneficial (but not absolutely essential) in fabricating the structure of FIG. 10d. However, other processes that are understood in the microelectronics art can be used to fabricate the structure of FIG. 10d. Moreover, FIGS. 10a through 10f illustrate one possible method for fabricating the wholly clad read-write conductor of the present invention. For instance, fabrication can be in an order that is the reverse of what is illustrated in FIGS. 10a through 10f. Fabrication can begin with the ferromagnetic data layer 11 and proceed with the intermediate layer 13, optionally the cap layer 15, followed by the formation of the cladded read-write conductor.

In the above mentioned processes, the materials for the cladding 21, the cap layer 15, the ferromagnetic data layer 11, the read-write conductor 19, and the intermediate layer 13 can include but are not limited to those set forth above in Table 1, Table 2, Table 3 and Table 4.

Figure 13A:
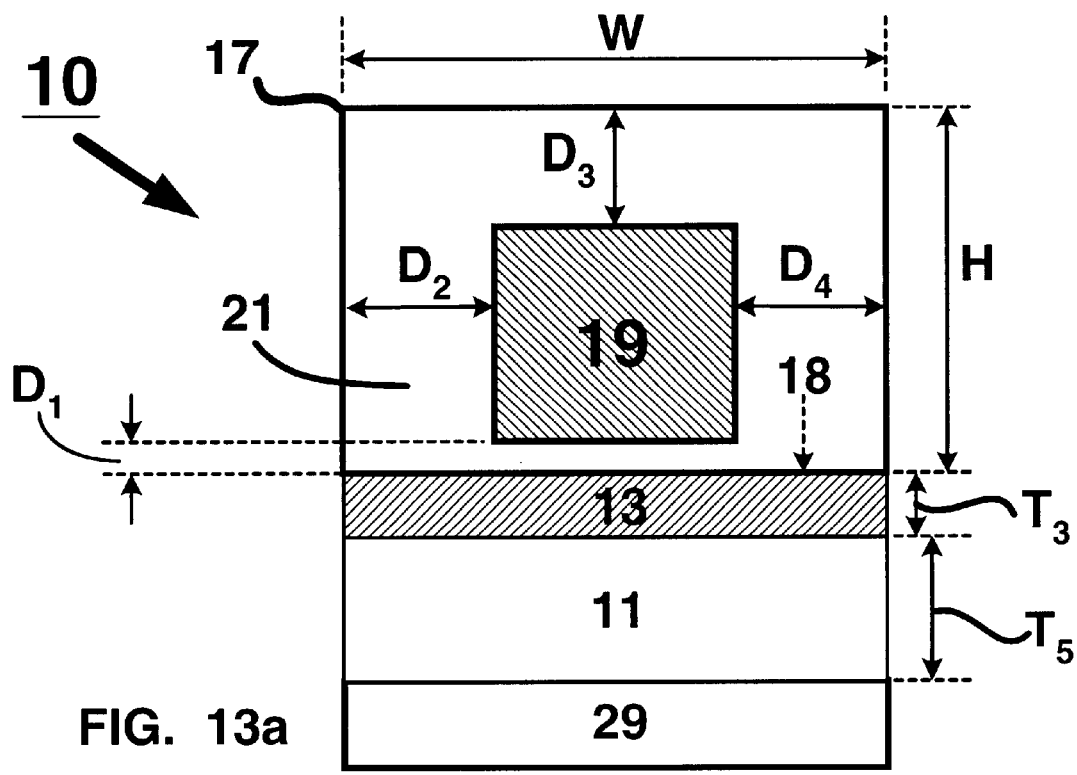
FIGS. 13a and 13b are an illustration of relative dimensions of a soft ferromagnetic reference layer with a ferromagnetic cladding and with a ferromagnetic cladding and a ferromagnetic cap layer respectively according to the present invention.

In FIG. 13a, dimensional relationships between the cladding 21, the intermediate layer 13, and the ferromagnetic data layer 11 are illustrated. As was mentioned previously, the soft magnetic materials for the cladding 21 are selected so that the read magnetic field $H_R$ generated by the read current $I_R$ flowing in the read-write conductor 19 will pin-on-the-fly the orientation of magnetization M1 of the soft ferromagnetic reference layer 17. Moreover, the resulting read magnetic field $H_R$ does not saturate the cladding 21 so that the read magnetic field $H_R$ is substantially contained within the cladding 21 during a read operation. Any portion of the read magnetic field H that does extend beyond the cladding 21 does not rotate the alterable orientation of magnetization M2 of the ferromagnetic data layer 11. In contrast, during a write operation, the first write magnetic field $H_{W1}$, saturates the cladding 21 and extends toward the ferromagnetic data layer 11. Consequently, the relative thicknesses of the cladding 21 must be tailored such that the read magnetic field $H_R$ is substantially contained therein during a read operation and the first write magnetic field $H_{W1}$ saturates the cladding 21 during a write operation.

In FIG. 13a, that portion of the cladding 21 that is adjacent to the intermediate layer 13 (i.e. the thinner portion as shown by dashed arrow 18) should have a minimum thickness $D_1$ that is sufficient to substantially contain the read magnetic field $H_R$ within the cladding 21 (i.e. thick enough to provide flux closure). The remainder of the cladding 21 can have thicknesses $D_2$, $D_3$, and $D_4$ that are greater than or equal to the minimum thickness $D_1$; therefore: $D_2$, $D_3$, and $D_4 \geq D_1$. Preferably, $D_2$, $D_3$, and $D_4$ have a thickness that is greater than $D_1$.

During a write operation, the first write magnetic field $H_{W1}$ saturates the cladding 21; however, it may be desirable to tailor the thickness of the cladding 21 so that $D_2$, $D_3$, and $D_4$ are substantially thicker than $D_1$ such that the first write magnetic field $H_{W1}$ saturates the cladding 21 along the thinner portion and in a direction that is substantially towards the ferromagnetic data layer 11. As a result, the first write magnetic field $H_{W1}$ is channeled in a direction towards the ferromagnetic data layer 11 and the fringe fields in a direction of the thicknesses $D_2$, $D_3$, and $D_4$ (i.e. the thicker portions) do not saturate the cladding 21 or at a minimum are substantially attenuated by the thickness of the cladding 21 at $D_2$, $D_3$, and $D_4$. Preferably, $D_2$, $D_3$, and $D_4$ have a thickness that is selected to prevent saturation of the cladding 21.

Figure 13B:
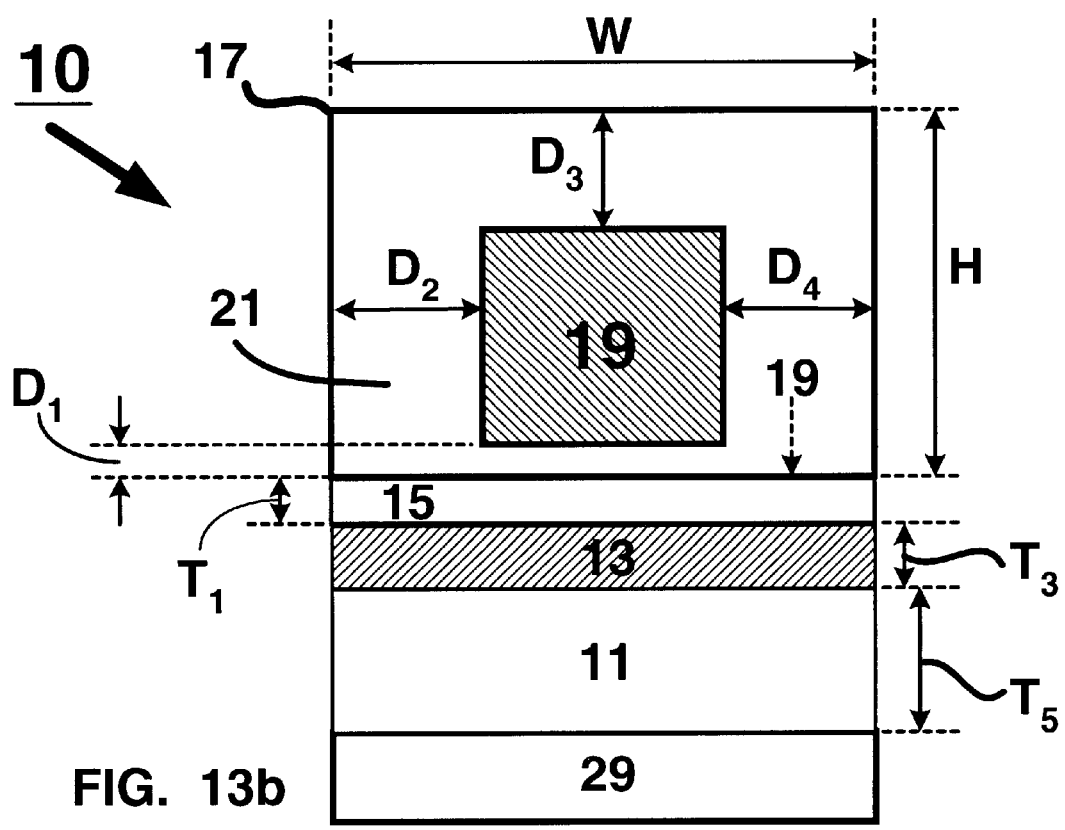

Similarly, in FIG. 13b, dimensional relationships between the cladding 21, the cap layer 15, the intermediate layer 13, and the ferromagnetic data layer 11 are illustrated. As was mentioned previously, the soft magnetic materials for the cladding 21 and the cap layer 15 are selected so that the read magnetic field $H_R$ generated by the read current $I_R$ flowing in the read-write conductor 19 will pin-on-the-fly the orientation of magnetization M1 of the soft ferromagnetic reference layer 17. Moreover, the resulting read magnetic field $H_R$ does not saturate the cladding 21 and the cap layer 15 so that the read magnetic field $H_R$ is substantially contained within the cladding 21 and the cap layer 15 (i.e. the cladding 21 and the cap layer 15 provide flux closure). Any portion of the read magnetic field $H_R$ that does extend beyond the cladding 21 and the cap layer 15 does not rotate the alterable orientation of magnetization M2 of the ferromagnetic data layer 11. Conversely, during a write operation, the first write magnetic field $H_{W1}$ saturates the cladding 21 and the cap layer 15 and extends toward the ferromagnetic data layer 11. Therefore, the relative thicknesses of the cladding 21 must be tailored such that the read magnetic field $H_R$ is substantially contained therein during a read operation and the first write magnetic field $H_{W1}$ saturates the cladding 21 and the cap layer 15 during a write operation.

In FIG. 13b, that portion of the cladding 21 that is adjacent to the cap layer 15 (see dashed arrows 19) should have a minimum combined thickness $(D_1+T_1)$ that is sufficient to substantially contain the read magnetic field H within the cladding 21 and the cap layer 15. The remainder of the cladding 21 can have thicknesses $D_2$, $D_3$, and $D_4$ that are greater than or equal to the minimum combined thickness $(D_1+T_1)$; therefore: $D_2$, $D_3$, and $D_4 \geq (D_1+T_1)$. Preferably, $D_2$, $D_3$, and $D_4$ have a thickness that is greater than $(D_1+T_1)$. As was mentioned above, $D_2$, $D_3$, and $D_4$ can be made substantially thicker than $(D_1+T_1)$ such that during a write operation the first write magnetic field $H_{W1}$ saturates the cladding 21 and the cap layer 15 in a direction that is substantially towards the ferromagnetic data layer 11.

Thickness and ranges of thickness for the cladding 21, the cap layer 15, the intermediate layer 13, and the ferromagnetic data layer 11 included but are not limited to those set forth below.

The cladding 21 can have a thickness $D_1$ that is from about 3.0 nm to about 100.0 nm and the cap layer 15 can have a thickness $T_1$ that is greater than about 1.0 nm. The actual thickness of $D_1$ and $T_1$ will depend on the materials selected for the cladding 21 and the cap layer 15.

The intermediate layer 13 can have a thickness $T_3$ that is from about 0.5 nm to about 5.0 nm. The actual thickness of $T_3$ will depend in part on the materials selected for the intermediate layer 13 and on the type of memory cell such as a TMR memory cell or a GMR memory cell, for example.

The ferromagnetic data layer 11 can have a thickness $T_1$ that is greater than about 1.0 nm. The actual thickness of $T_5$ will depend on the type of memory cell and the application.

The soft ferromagnetic reference layer 17 can have a width W and a height H that depends in part on the dimensions selected for the read-write conductor 19 and the thicknesses $D_1$, $D_2$, $D_3$, and $D_4$ of the cladding 21. Therefore, W and H will be highly application dependent because there ultimate dimensions will be based on many variables including the dimensions of the cladding 21 and the read-write conductor 19.

Although several embodiments of the present invention have been disclosed and illustrated, the invention is not limited to the specific forms or arrangements of parts so described and illustrated. The invention is only limited by the claims.

What is claimed is:

1. A magnetic memory cell comprising:
   a ferromagnetic data layer for storing a bit of data as an alterable orientation of magnetization;
   a first conductor in electrical communication with the ferromagnetic data layer;
   an intermediate layer in contact with the ferromagnetic data layer; and
   a soft ferromagnetic reference layer having a non-pinned orientation of magnetization and including a read-write conductor and a ferromagnetic cladding that completely surrounds the read-write conductor, the ferromagnetic cladding having a tailored thickness including a thinner portion along a portion of the ferromagnetic cladding that is in contact with the intermediate layer and a thicker portion along portions of the ferromagnetic cladding that are not in contact with the intermediate layer,
   wherein during a read operation the soft ferromagnetic reference layer is pinned-on-the-fly to a desired orientation by a read magnetic field generated by a read current flowing in the read-write conductor and the read magnetic field does not saturate and is substantially contained within the ferromagnetic cladding, and
   wherein during a write operation the first conductor is operative to generate a first write magnetic field in response to a first write current flowing in the first conductor and the first write magnetic field saturates the thinner portion of the ferromagnetic cladding and extends outward to the ferromagnetic data layer.

2. The magnetic memory cell as set forth in claim 1 wherein any selected one or more of the ferromagnetic data layer and the ferromagnetic cladding comprises a high magnetic permeability soft magnetic material.

3. The magnetic memory cell as set forth in claim 2 wherein the high magnetic permeability soft magnetic material is a material selected from the group consisting of nickel iron, a nickel iron alloy, nickel iron cobalt, a nickel iron cobalt alloy, cobalt iron, a cobalt iron alloy, and PERMALLOY.

4. The magnetic memory cell as set forth in claim 1 wherein the ferromagnetic data layer and the ferromagnetic cladding are made from an identical high magnetic permeability soft magnetic material.

5. The magnetic memory cell as set forth in claim 1 wherein any selected one or more of the ferromagnetic data layer and the ferromagnetic cladding has a relative magnetic permeability greater than about 1000.

6. The magnetic memory cell as set forth in claim 1 wherein any selected one or more of the ferromagnetic data layer and the ferromagnetic cladding has a coercivity of about 1000 A/m or less.

7. The magnetic memory cell as set forth in claim 1 wherein the read-write conductor is an electrically conductive material selected from the group consisting of copper, a copper alloy, aluminum, an aluminum alloy, aluminum copper, an aluminum copper alloy, tantalum, a tantalum alloy, gold, a gold alloy, silver, and a silver alloy.

8. The magnetic memory cell as set forth in claim 1 wherein the tailored thickness of the ferromagnetic cladding is from about 3.0 nm to about 100.0 nm along a portion of the ferromagnetic cladding that is not in contact with the intermediate layer.

9. The magnetic memory cell as set forth in claim 1 wherein the intermediate layer has a thickness from about 0.5 nm to about 5.0 nm.

10. The magnetic memory cell as set forth in claim 1 wherein the ferromagnetic data layer has a thickness greater than about 1.0 nm.

11. The magnetic memory cell as set forth in claim 1 and further comprising:
   a ferromagnetic cap layer positioned between the ferromagnetic cladding and the intermediate layer and magnetically coupled with the ferromagnetic cladding, the ferromagnetic cladding having a tailored thickness including a thinner portion along a portion of the ferromagnetic cladding that is in contact with the ferromagnetic cap layer and a thicker portion along portions of the ferromagnetic cladding that are not in contact with the ferromagnetic cap layer,
   wherein during the read operation the read magnetic field generated does not saturate and is substantially contained within the ferromagnetic cladding and the ferromagnetic cap layer, and
   wherein during the write operation the first write magnetic field saturates the thinner portion of the ferromagnetic cladding and the ferromagnetic cap layer and extends outward to the ferromagnetic data layer.

12. The magnetic memory cell as set forth in claim 11 wherein the ferromagnetic cap layer has a thickness greater than about 1.0 nm.

13. The magnetic memory cell as set forth in claim 11 wherein the ferromagnetic cap layer is made from a high magnetic permeability soft magnetic material selected from the group consisting of nickel iron, a nickel iron alloy, nickel iron cobalt, a nickel iron cobalt alloy, cobalt iron, a cobalt iron alloy, and PERMALLOY.

14. The magnetic memory cell as set forth in claim 11 wherein the tailored thickness of the ferromagnetic cladding is from about 1.0 nm to about 5.0 nm along the thinner portion of the ferromagnetic cladding.

15. The magnetic memory cell as set forth in claim 11 wherein the ferromagnetic cap layer and the portion of the ferromagnetic cladding that is in contact with the ferromagnetic cap layer have a combined thickness from about 2.0 nm to about 10.0 nm.

16. The magnetic memory cell as set forth in claim 1 wherein the soft ferromagnetic reference layer and the first conductor are a pair of intersecting conductors selected from the group consisting of a row conductor and a column conductor respectively, and a column conductor and a row conductor respectively, and the magnetic memory cell is positioned between at an intersecting region between the conductors.

17. The magnetic memory cell as set forth in claim 1 wherein the intermediate layer is a tunnel barrier layer made from a dielectric material.

18. The magnetic memory cell as set forth in claim 17 wherein the dielectric material is a material selected from the group consisting of silicon oxide, magnesium oxide, silicon nitride, aluminum oxide, aluminum nitride, and tantalum oxide.

19. The magnetic memory cell as set forth in claim 17 wherein the tunnel barrier layer has a thickness from about 0.5 nm to about 5.0 nm.

20. The magnetic memory cell as set forth in claim 1 wherein the intermediate layer is a spacer layer made from a non-magnetic material selected from the group consisting of a $3d$, a $4d$, and a $5d$ transition metal.

21. The magnetic memory cell as set forth in claim 20 wherein the non-magnetic material is a material selected from the group consisting of copper, gold, and silver.

22. The magnetic memory cell as set forth in claim 20 wherein the spacer layer has a thickness from about 0.5 nm to about 5.0 nm.

23. In a magnetic memory cell memory cell including a ferromagnetic data layer for storing a bit of data as an alterable orientation of magnetization, a first conductor in electrical communication with the ferromagnetic data layer, a ferromagnetic reference layer having an orientation of magnetization that is pinned in a known direction, a second conductor in electrical communication with the reference layer, and an intermediate layer between the ferromagnetic data layer and the reference layer, and wherein the bit is read by measuring a resistance between the first and second conductors and the bit is written by passing first and second currents through the first and second conductors to generate first and second write magnetic fields that cooperatively interact with the ferromagnetic data layer to rotate the alterable orientation of magnetization, the improvement comprising:
   a soft ferromagnetic reference layer having a non-pinned orientation of magnetization and including a read-write conductor and a ferromagnetic cladding that completely surrounds the read-write conductor, the ferromagnetic cladding having a tailored thickness including a thinner portion along a portion of the ferromagnetic cladding that is in contact with the intermediate layer and a thicker portion along portions of the ferromagnetic cladding that are not in contact with the intermediate layer,
   wherein during a read operation the soft ferromagnetic reference layer is pinned-on-the-fly to a desired orientation by a read magnetic field generated by a read current flowing in the read-write conductor and the read magnetic field does not saturate and is substantially contained within the ferromagnetic cladding, and
   wherein during a write operation the first conductor is operative to generate a first write magnetic field in response to a first write current flowing in the first conductor and the first write magnetic field saturates the thinner portion of the ferromagnetic cladding and extends outward to the ferromagnetic data layer.

24. The magnetic memory cell as set forth in claim 23 wherein any selected one or more of the ferromagnetic data layer and the ferromagnetic cladding comprises a high magnetic permeability soft magnetic material.

25. The magnetic memory cell as set forth in claim 24 wherein the high magnetic permeability soft magnetic material is a material selected from the group consisting of nickel iron, a nickel iron alloy, nickel iron cobalt, a nickel iron cobalt alloy, cobalt iron, a cobalt iron alloy, and PERMALLOY.

26. The magnetic memory cell as set forth in claim 23 wherein the ferromagnetic data layer and the ferromagnetic cladding are made from an identical high magnetic permeability soft magnetic material.

27. The magnetic memory cell as set forth in claim 23 wherein any selected one or more of the ferromagnetic data layer and the ferromagnetic cladding has a relative magnetic permeability greater than about 1000.

28. The magnetic memory cell as set forth in claim 23 wherein any selected one or more of the ferromagnetic data layer and the ferromagnetic cladding has a coercivity of about 1000 A/m or less.

29. The magnetic memory cell as set forth in claim 23 wherein the read-write conductor is an electrically conductive material selected from the group consisting of copper, a copper alloy, aluminum, an aluminum alloy, aluminum copper, an aluminum copper alloy, tantalum, a tantalum alloy, gold, a gold alloy, silver, and a silver alloy.

30. The magnetic memory cell as set forth in claim 23 wherein the tailored thickness of the ferromagnetic cladding is from about 3.0 nm to about 100.0 nm along a portion of the ferromagnetic cladding that is not in contact with the intermediate layer.

31. The magnetic memory cell as set forth in claim 23 wherein the intermediate layer has a thickness from about 0.5 nm to about 5.0 nm.

32. The magnetic memory cell as set forth in claim 23 wherein the ferromagnetic data layer has a thickness greater than about 1.0 nm.

33. The magnetic memory cell as set forth in claim 23 and further comprising:
   a ferromagnetic cap layer positioned between the ferromagnetic cladding and the intermediate layer and magnetically coupled with the ferromagnetic cladding, the ferromagnetic cladding having a tailored thickness including a thinner portion along a portion of the ferromagnetic cladding that is in contact with the ferromagnetic cap layer and a thicker portion along portions of the ferromagnetic cladding that are not in contact with the ferromagnetic cap layer,
   wherein during the read operation the read magnetic field generated does not saturate and is substantially contained within the ferromagnetic cladding and the ferromagnetic cap layer, and
   wherein during the write operation the first write magnetic field saturates the thinner portion of the ferromagnetic cladding and the ferromagnetic cap layer and extends outward to the ferromagnetic data layer.

34. The magnetic memory cell as set forth in claim 33 wherein the ferromagnetic cap layer has a thickness greater than about 1.0 nm.

35. The magnetic memory cell as set forth in claim 33 wherein the ferromagnetic cap layer is made from a high magnetic permeability soft magnetic material selected from the group consisting of nickel iron, a nickel iron alloy, nickel iron cobalt, a nickel iron cobalt alloy, cobalt iron, a cobalt iron alloy, and PERMALLOY.

36. The magnetic memory cell as set forth in claim 33 wherein the tailored thickness of the ferromagnetic cladding is from about 1.0 nm to about 5.0 nm along the thinner portion of the ferromagnetic cladding.

37. The magnetic memory cell as set forth in claim 33 wherein the ferromagnetic cap layer and the portion of the ferromagnetic cladding that is in contact with the ferromagnetic cap layer have a combined thickness from about 2.0 nm to about 10.0 nm.

38. The magnetic memory cell as set forth in claim 23 wherein the intermediate layer is a tunnel barrier layer made from a dielectric material.

39. The magnetic memory cell as set forth in claim 38 wherein the dielectric material is a material selected from the group consisting of silicon oxide, magnesium oxide, silicon nitride, aluminum oxide, aluminum nitride, and tantalum oxide.

40. The magnetic memory cell as set forth in claim 38 wherein the tunnel barrier layer has a thickness from about 0.5 nm to about 5.0 nm.

41. The magnetic memory cell as set forth in claim 23 wherein the intermediate layer is a spacer layer made from a non-magnetic material selected from the group consisting of a 3d, a 4d, and a 5d transition metal.

42. The magnetic memory cell as set forth in claim 41 wherein the non-magnetic material is a material selected from the group consisting of copper, gold, and silver.

43. The magnetic memory cell as set forth in claim 41 wherein the spacer layer has a thickness from about 0.5 nm to about 5.0 nm.

* * * * *